United States Patent
Kim et al.

(10) Patent No.: US 10,990,740 B2
(45) Date of Patent: Apr. 27, 2021

(54) INTEGRATED CIRCUITS INCLUDING STANDARD CELLS AND METHODS OF MANUFACTURING THE INTEGRATED CIRCUITS

(71) Applicant: Samsung Electronics Co., Ltd., Suwon-si (KR)

(72) Inventors: Jin-Tae Kim, Daejeon (KR); Sung-We Cho, Hwaseong-si (KR); Tae-Joong Song, Seongnam-si (KR); Seung-Young Lee, Seoul (KR); Jin-Young Lim, Seoul (KR)

(73) Assignee: Samsung Electronics Co., Ltd.

( * ) Notice: Subject to any disclaimer, the term of this patent is extended or adjusted under 35 U.S.C. 154(b) by 91 days.

(21) Appl. No.: 16/378,751

(22) Filed: Apr. 9, 2019

(65) Prior Publication Data

US 2020/0050728 A1 Feb. 13, 2020

(30) Foreign Application Priority Data

Aug. 10, 2018 (KR) ........................ 10-2018-0093996

(51) Int. Cl.
*G06F 30/392* (2020.01)
*H01L 27/02* (2006.01)
*G06F 30/394* (2020.01)
*G06F 30/398* (2020.01)

(52) U.S. Cl.
CPC .......... *G06F 30/392* (2020.01); *G06F 30/394* (2020.01); *G06F 30/398* (2020.01); *H01L 27/0207* (2013.01)

(58) Field of Classification Search
CPC .... G06F 30/392; G06F 30/398; G06F 30/394; H01L 27/0207
USPC ......................................................... 716/119
See application file for complete search history.

(56) References Cited

U.S. PATENT DOCUMENTS

| | | |
|---|---|---|
| 8,504,969 B2 | 8/2013 | Lin et al. |
| 8,788,998 B2 | 7/2014 | Hatamian et al. |
| 9,007,095 B2 | 4/2015 | Penzes |
| 9,626,472 B2 | 4/2017 | Chiang et al. |
| 9,697,319 B2 | 7/2017 | Lee et al. |
| 9,842,184 B2 | 12/2017 | Mittal et al. |
| 2002/0039316 A1* | 4/2002 | Tobita ............... G11C 11/40603 365/222 |

(Continued)

FOREIGN PATENT DOCUMENTS

JP 2004-228390 A 8/2004

*Primary Examiner* — Suresh Memula
(74) *Attorney, Agent, or Firm* — Myers Bigel, P.A.

(57) ABSTRACT

An integrated circuit may include a first standard cell including first and second active regions extending in a first horizontal direction and a first gate line extending in a second horizontal direction orthogonal to the first horizontal direction; and a second standard cell including third and fourth active regions extending in the first horizontal direction and a second gate line aligned in parallel to the first gate in the second horizontal direction and being adjacent to the first standard cell. A distance between the second active region of the first standard cell and the third active region of the second standard cell may be greater than a distance between the first and second active regions of the first standard cell, and may be greater than a distance between the third and fourth active regions of the second standard cell.

20 Claims, 14 Drawing Sheets

(56) References Cited

U.S. PATENT DOCUMENTS

| | | | |
|---|---|---|---|
| 2004/0089881 A1* | 5/2004 | Ono | H01L 27/0207 257/208 |
| 2005/0044522 A1* | 2/2005 | Maeda | H01L 27/0207 716/53 |
| 2010/0269081 A1* | 10/2010 | Hou | G06F 30/39 716/123 |
| 2014/0097493 A1* | 4/2014 | Baek | H01L 29/6681 257/347 |
| 2017/0256446 A1 | 9/2017 | Cha et al. | |
| 2018/0190640 A1* | 7/2018 | Shimbo | H01L 23/528 |
| 2018/0294219 A1* | 10/2018 | Kim | H01L 27/0207 |
| 2019/0164949 A1* | 5/2019 | Sio | H01L 27/0207 |
| 2019/0355749 A1* | 11/2019 | Do | G06F 30/39 |
| 2020/0006481 A1* | 1/2020 | Yang | H01L 29/7851 |
| 2020/0051977 A1* | 2/2020 | Lim | H01L 23/535 |
| 2020/0273850 A1* | 8/2020 | Shimbo | H01L 23/528 |

\* cited by examiner

INTEGRATED CIRCUITS INCLUDING STANDARD CELLS AND METHODS OF MANUFACTURING THE INTEGRATED CIRCUITS

CROSS-REFERENCE TO RELATED APPLICATION

This application claims the benefit of Korean Patent Application No. 10-2018-0093996, filed on Aug. 10, 2018, in the Korean Intellectual Property Office, the disclosure of which is incorporated by reference herein in its entirety.

TECHNICAL FIELD

The present disclosure relates to integrated circuits, and more particularly, to integrated circuits including standard cells and to methods of manufacturing the integrated circuits.

BACKGROUND

An integrated circuit may include a plurality of standard cells arranged in a plurality of rows. The capabilities and/or characteristics of standard cells, such as power consumption, operation speed, and the like, may be highly related to the capabilities and/or characteristics of an integrated circuit that includes the standard cells. Accordingly, standard cells having improved capabilities and/or characteristics and high reliability of operation may be desirable. It may also be important to shorten a development period of standard cells to shorten the time to market.

SUMMARY

The present disclosure and the inventive concepts disclosed herein, which relate to integrated circuits including standard cells, provide an integrated circuit including standard cells with improved characteristics. The present disclosure and the inventive concepts disclosed herein also provide methods of manufacturing the integrated circuits.

According to an aspect of the present disclosure, there is provided an integrated circuit. The integrated circuit may include a first standard cell including at least first and second active regions extending in a first horizontal direction and a first gate line extending in a second horizontal direction orthogonal to the first horizontal direction; and the integrated circuit may further include a second standard cell including at least third and fourth active regions extending in the first horizontal direction and a second gate line aligned in parallel to the first gate line in the second horizontal direction and being adjacent to the first standard cell. A distance between the second active region of the first standard cell and the third active region of the second standard cell may be greater than a distance between the first and second active regions of the first standard cell, and the distance between the second active region of the first standard cell and the third active region of the second standard cell may be greater than a distance between the third and fourth active regions of the second standard cell.

According to another aspect of the inventive concept, there is provided an integrated circuit including a plurality of standard cells. The integrated circuit may include: a plurality of active region pairs, each active region pair including a first active region of a first conductive type and a second active region of a second conductive type respectively extending in a first horizontal direction and adjacent to each other; and a plurality of gate lines extending in a second horizontal direction orthogonal to the first horizontal direction. A first and second active region pair may be arranged adjacent to each other, and a distance between the first and second active region pair may be greater than a distance between the first active region and the second active region of the first active region pair.

According to yet another aspect of the inventive concept, there is provided an integrated circuit including a plurality of standard cells in a plurality of rows. The integrated circuit may include: first and second active regions extending in a first horizontal direction in a first row; and third and fourth active regions extending in the first horizontal direction in a second row adjacent to the first row. The second and third active regions may be adjacent to one another. A distance between the second active region of the first row and the third active region of the second row may be greater than a distance between the first and second active regions in the first row, and greater than a distance between the third and fourth active regions in the second row.

BRIEF DESCRIPTION OF THE DRAWINGS

For convenience of illustration, the drawings accompanying the specification may not be to scale, and sizes of components may be exaggerated.

Aspects of the present disclosure will be more clearly understood from the following detailed description taken in conjunction with the accompanying drawings in which.

DETAILED DESCRIPTION

Figure 1:
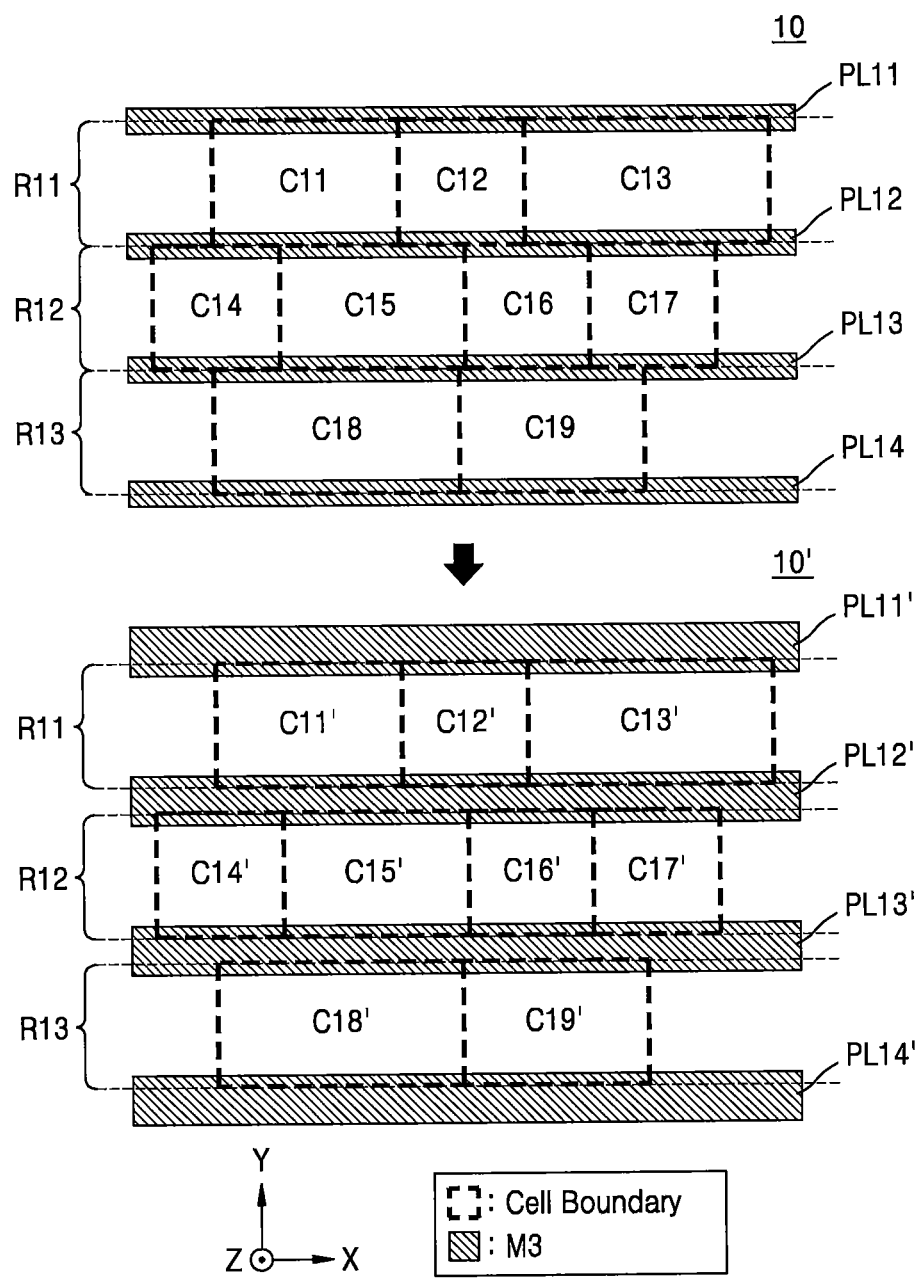
FIG. 1 is a diagram schematically illustrating part of integrated circuits according to an example embodiment of the inventive concepts.

FIG. 1 is a diagram schematically illustrating a portion of each of integrated circuits 10 and 10' according to example embodiments of the inventive concepts. More particularly, the upper image of FIG. 1 is a top plan view that illustrates a layout of the integrated circuit 10, and the lower image of FIG. 1 is a top plan view that illustrates a layout of the integrated circuit 10' which provides power integrity that is improved over the power integrity of the integrated circuit 10. The integrated circuit 10 includes a plurality of standard cells C11 through C19 on a plane including an X axis and a Y axis, and the integrated circuit 10' includes a plurality of standard cells C11' through C19' on a plane including an X axis and a Y axis. Herein, an X axis direction and a Y axis direction may respectively be referred to as a first horizontal axis and a second horizontal axis, and a Z axis direction may be referred to as a vertical direction. A plane including the X axis and the Y axis may be referred to as a horizontal plane. A component disposed in a +Z axis direction with respect to another component may be referred to as being on or above the other component, and a component disposed in a −Z axis direction with respect to another component may be referred to as being under or below the other component. Unless otherwise indicated in the specification, a height of a component may indicate a length in the Y axis direction of the component. In addition, an area of a component may refer to a size occupied by the component in the horizontal plane and planes parallel to the horizontal plane. In the accompanying drawings of the specification, for convenience of illustration, some layers may be omitted, and to describe connections between a metal layer pattern and a sub-conductive pattern, vias may be illustrated when they are located under the metal layer pattern.

A standard cell, which is a unit of a layout included in the integrated circuit, may simply be referred to as a cell in this specification. An integrated circuit may include a plurality of various standard cells. The standard cells may have a structure that conforms to a predetermined standard (e.g., standard cells may conform to one of a plurality of predetermined heights and/or one of a plurality of predetermined areas) and may be aligned in a layout of an integrated circuit in a plurality of rows. For example, as shown in the upper image of FIG. 1, a first cell C11, second cell C12, and a third cell C13 may be placed in a first row R11, a fourth cell C14, a fifth cell C15, a sixth cell C16, and a seventh cell C17 may be placed in a second row R12, and an eighth cell C18 and a ninth cell C19 may be placed in a third row R13. The first to third rows R11 to R13 may have the same height, and accordingly, each of the first cell C11 through the ninth cell C19 may have the same height, that is, a length in the Y axis direction.

Improving the performance of the standard cells may be desirable as part of an effort to improve the performance of the integrated circuit 10. For example, the performance of the standard cells may be improved by increasing an area of an active region in the standard cell. As it will be described hereinafter with reference to FIG. 4 and so on, the first cell C11 through the ninth cell C19 may each include active regions extending in the X axis direction. As the height (i.e. the length in the Y axis direction) of the active region increases, a size of a transistor may also increase, and due to a high current that is provided by the transistor having increased size, the operation speed of the standard cell may be faster. However, increasing the height of the active region may result in an increase in the area of the standard cell, and when a Fin Field-Effect Transistor (FinFET) is used, to increase the number of fins, the height of the active region may increase according to a pitch of the fin. In addition, in the standard cell, an area of an active region for an N-channel Field-Effect Transistor (NFET) and an area an active region for a P-channel Field-Effect Transistor (PFET), which are parallel to each other, may both be increased, and thus, the area of the standard cell may be significantly increased. Herein, a pitch, which is a unit indicating a degree in which two components are spaced apart from each other, may refer to a distance between centers of the two components. Herein, pitch may also refer to a space defined by the two components that are spaced apart from each other.

In some embodiments, the performance of the standard cells may be improved by enhancing power supply to the standard cells. As shown in the upper image of FIG. 1, the integrated circuit 10 may include power lines PL11 through PL14 extending in the X axis direction on the boundaries of the first row R11 through the third row R13. The power lines may provide a supply voltage for providing power to the first cell C11 through the ninth cell C19 is applied, and the power lines PL11 through PL14 may be included in a power rail of the integrated circuit 10. In some embodiments, a positive supply voltage may be applied to odd-numbered power lines PL11 and PL13; on the other hand, a ground voltage (or a negative supply voltage) may be applied to even-numbered power lines PL12 and PL14. In some embodiments, the ground voltage may be applied to the odd-numbered power lines PL11 and PL13; on the other hand, the positive supply voltage may be applied to the even-numbered power lines PL12 and PL14. The power lines PL11 through PL14, which may be formed in M3 metal layers as shown in FIG. 1, may also and/or alternatively be formed in other conductive layers including M1 metal layers. According to a result of an examination undertaken by the inventors, when considering an increase in the area of the standard cells, enhancing power supply to the standard cells, that is, enhancing the power integrity, may be more beneficial than increasing the number of fins. Accordingly, to enhance power integrity, reducing an IR drop (that is, a voltage drop) occurring in the power lines PL11 through PL14 (or the power rail) may be desirable.

In some embodiments, widths of the power lines PL11 through PL14 may be increased while maintaining a structure of the first cell C11 through the ninth cell C19 of the integrated circuit 10. For example, as shown in the lower image of FIG. 1, compared to the integrated circuit 10, standard cells placed in different rows among a first cell C11' through a ninth cell C19' in the integrated circuit 10' may be spaced apart from one another in the Y axis direction. That is, the standard cells of the first row R11 may be spaced apart from the standard cells of the second row R12. Power lines PL11' through PL14' may each have an increased width as compared to power lines PL11 through PL14, and a spacing between power lines in the integrated circuit 10' (e.g., power line PL11' and power line PL12') may be the same as a spacing between power lines in the integrated circuit 10 (e.g., power line PL11 and power line PL12). When the performance of the first cell C11 through the ninth cell C19 of the integrated circuit 10 shown in the upper image of FIG. 1 is verified, the integrated circuit 10' shown in the lower image of FIG. 1 may include the first cell C11' through the ninth cell C19' that are identical to the first cell C11 through the ninth cell 19 in the integrated circuit 10 to provide the verified performances, provide improved performance by the enhanced power integrity, and may reduce the time to market, including significantly reducing the time to market. In addition, as the widths of the power lines PL11' through PL14' may be adjusted according to various factors regarding the integrated circuit 10', the integrated circuit 10' having improved performance or optimized performance to meet demand of users may be provided.

Figure 2:
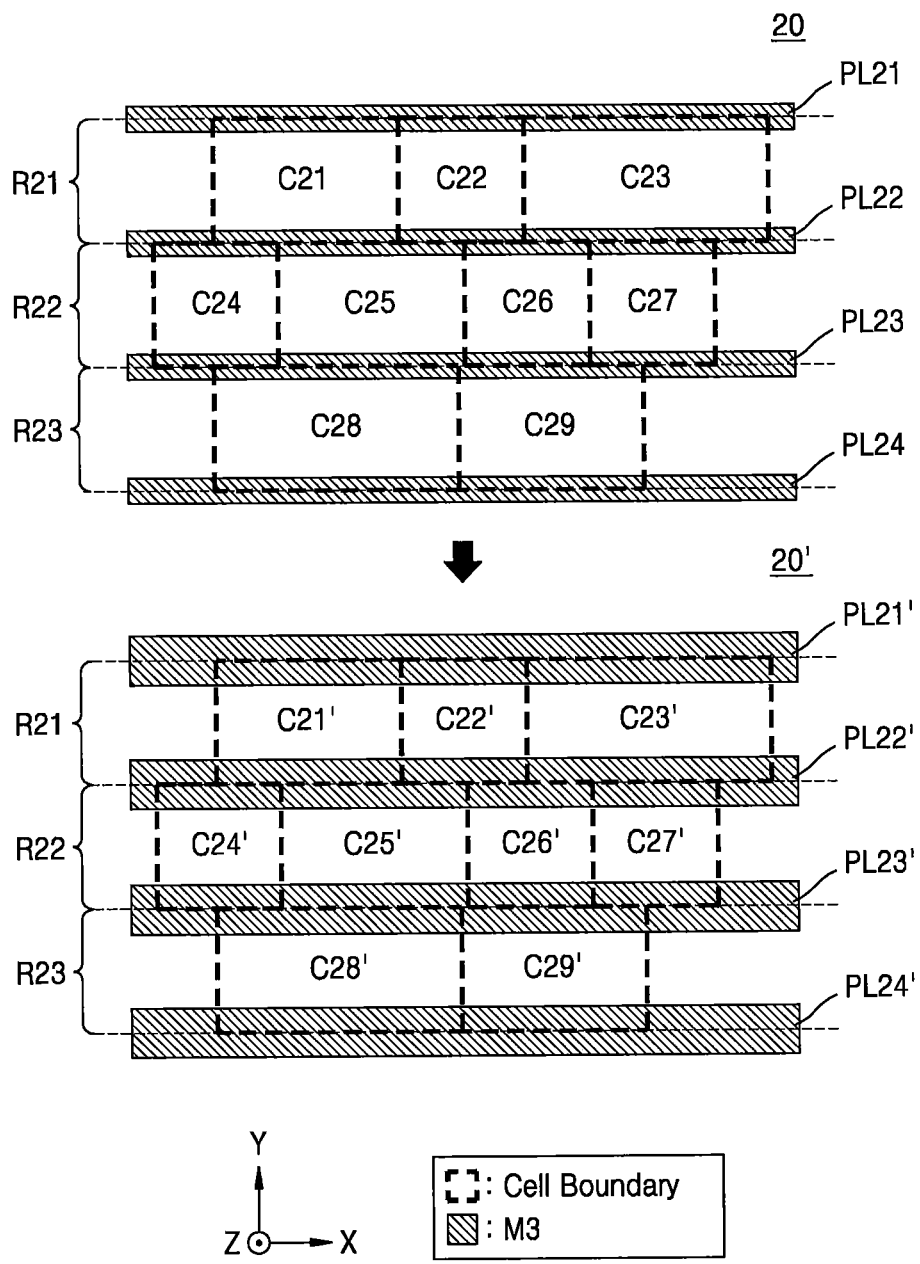
FIG. 2 is a diagram schematically illustrating part of integrated circuits according to a comparative example.

FIG. 2 is a diagram schematically illustrating part of integrated circuits according to comparative examples. More particularly, the upper image of FIG. 2 is a top plan view illustrating a layout of an integrated circuit 20 that is identical to the integrated circuit 10 shown in FIG. 1, and the lower image of FIG. 2 is a top plan view illustrating a layout of an integrated circuit 20' according to a comparative example for enhancing power integrity of the integrated circuit 20. Hereinafter, from descriptions of FIG. 2, descriptions overlapping those of FIG. 1 will be omitted.

As shown in the upper image of FIG. 2, the integrated circuit 20 may include a first cell C21 through a ninth cell C29 placed in a first row R21 through a third row R23 and further include power lines PL21 through PL24 extending, in parallel to one another, in the X axis direction. To enhance power integrity, only widths of the power lines PL21 through PL24 may be increased, and the integrated circuit 20', as shown in the lower portion of FIG. 2, may include power lines PL21' through PL24' having increased widths in a state where a first cell C21' through a ninth cell C29' are placed, in the first row R21 through the third row R23, in the same way as the first cell C21 through the ninth cell C29 of the integrated circuit 20.

Due to the increased widths of the power lines PL21' through PL24', widths between the power lines PL21' through PL24' may be less than widths between the power lines PL21 through PL24 in the integrated circuit 20, and thus, widths for routing signals within and/or between standard cells may be decreased. For example, in the integrated circuit 20', M3 metal layers may respectively include patterns extending in the X axis direction, and due to the power lines PL21' through PL24', the number of tracks, that is, the number of patterns extending in the X axis direction on one standard cell, may decrease. As a result, routing congestion may occur in the integrated circuit 20; alternatively, a state in which routing may not be performed may occur. In addition, widths of power lines in the M1 metal layers may be increased due to patterns of the M1 metal layers that are included in the first cells C21' through the ninth cell C29'. On the other hand, the integrated circuit 10' of FIG. 1 may, by increasing the widths of the power lines while maintaining the structure of the standard cells, achieve beneficial effects as described above with reference to FIG. 1.

Figure 3A:
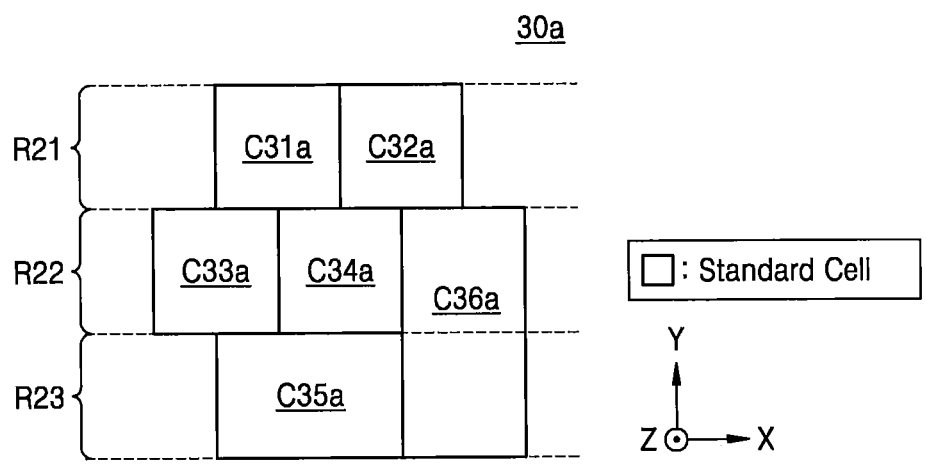
FIGS. 3A and 3B are top-plan views schematically showing parts of integrated circuits according to example embodiments of the inventive concepts.
Figure 3B:
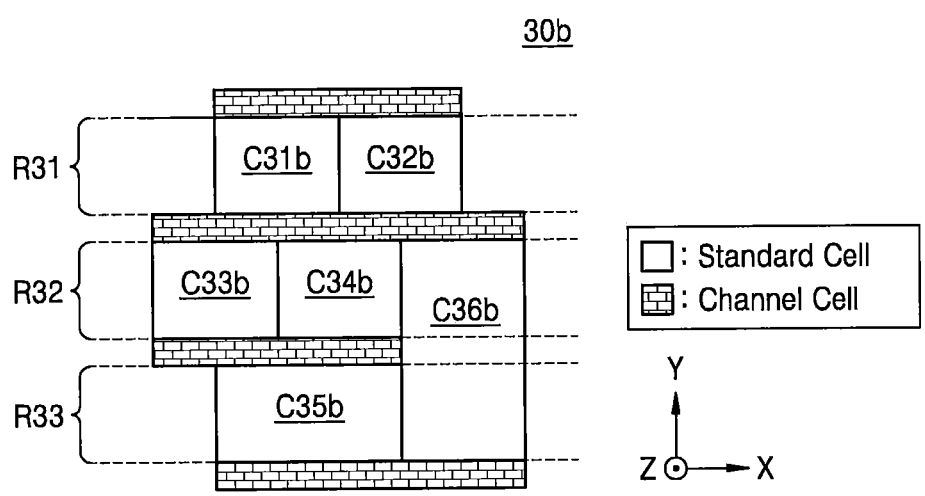

FIGS. 3A and 3B are top plan views schematically illustrating parts of integrated circuits 30a and 30b according to example embodiments of the inventive concepts. More particularly, FIGS. 3A and 3B, like the integrated circuit 10' in FIG. 1, illustrate examples of the integrated circuits 30a and 30b respectively including power lines with enlarged widths, having same layouts and different boundaries of the standard cells. As it will be described after with reference to FIGS. 10, 11A, and 11B, in a process of manufacturing an integrated circuit, a layout of the integrated circuit may be formed in various methods.

Referring to FIG. 3A, the integrated circuit 30a may include a first cell C31a through a sixth cell C36a placed in a first row R31 through a third row R33. A cell placed in one row, like the first cell C31a, may be referred to as a single height cell, and a cell continuously placed in at least two rows adjacent to one another, like the sixth cell C36a, may be referred to as a multiple height cell. In some embodiments, standard cells for power lines having enlarged widths may be defined in advance, and a layout of an integrated circuit may be formed by placing the standard cells. For example, as shown in FIG. 3A, the first cell C31a through the sixth cell C36a may, to have increased heights to accommodate the power lines having enlarged widths, be defined in advance based on, for example, a first cell C31b through a sixth cell C36b shown in FIG. 3B. In some embodiments, heights of the standard cells may be increased in or during a process of placing the standard cells, and the standard cells having the increased heights may be placed.

Referring to FIG. 3B, the integrated circuit 30b may include the first cell C31b through the sixth cell C36b placed in the first row R31 through the third row R33. In some embodiments, like the first cell C11 through the ninth cell C19 shown in FIG. 1, the standard cells that are defined in advance may be placed apart from one another in the Y axis direction, and after the standard cells are placed, channel cells may be placed between the standard cells. For example, as shown in FIG. 3B, from among the first cell C31b through a fifth cell C35b, cells placed in different rows may be apart from one another in the Y axis direction, and the channel cells may be placed between the first cell C31b through the fifth cell C35b. Each of the channel cells may include at least a part of the power lines having the enlarged widths. In some embodiments, a multiple height cell, such as the sixth cell C36b, unlike the single height cells (for example, the first cell C31b through the fifth cell C35b), may be defined in advance to match the power lines having the enlarged widths. Hereinafter, unless otherwise mentioned, the layout of the integrated circuit according to example embodiments will be described mainly based on the case of FIG. 3B in which the standard cells are placed apart from one another in the Y axis direction, but the present disclosure is not limited thereto.

Figure 4:
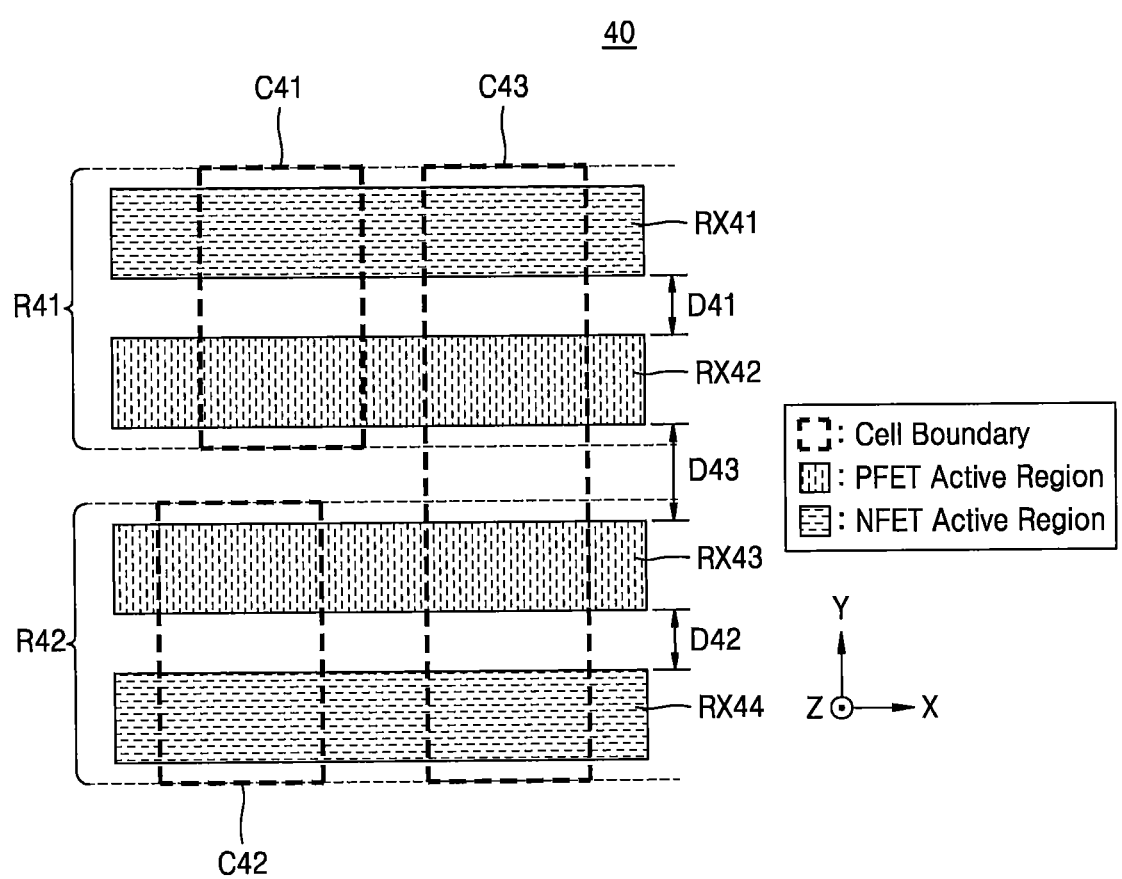
FIG. 4 is a top-plan view schematically illustrating a part of an integrated circuit according to an example embodiment of the inventive concepts.

FIG. 4 is a top plan view schematically illustrating a part of an integrated circuit 40 according to an example embodiment of the inventive concepts. More particularly, FIG. 4 illustrates a layout of an integrated circuit 40 including standard cells C41, C42, and C43. Standard cells C41 and C42 are spaced apart from one another in the Y axis direction for the power lines having the enlarged widths. Standard cell C43 is a multiple height cell dimensioned to match the power lines having the enlarged widths. To aid in describing FIG. 4, the figure illustrates only active regions RX41 through RX44.

The integrated circuit 40 may include a first cell C41 through a third cell C43 placed in a first row R41 and a second row R42. The integrated circuit 40 may include the active regions RX41 through RX44 that extend in the X axis direction in parallel to the first row R41 and the second row R42, and gate lines extending in the Y axis direction on the active regions R41 through RX44. In some embodiments, active regions may be formed in a substrate. The substrate may include a semiconductor such as silicon (Si) or germanium (Ge); a compound semiconductor such as silicon-germanium (SiGe), silicon carbide (SiC), gallium arsenide (GaAs), indium arsenide (InAs), and/or indium phosphide (InP); a conductive region, for example, a well doped with an impurity; or a structure doped with an impurity. In some embodiments, gate lines may include a layer including a work function metal or a gap fill metal layer. For example, the layer including the work function metal may include at least one of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), and the gap fill metal layer may include a W layer or an aluminum (Al) layer. In some embodiments, the gate lines may include a layered structure of TiAlC/TiN/W, a layered structure of TiN/TaN/TiAlC/TiN/W, or a layered structure of TiN/TaN/TiN/TiAlC/TiN/W. In addition, the integrated circuit 40 may include a plurality of fins (for example, F01 shown in FIG. 7A) extending in the X axis direction on the active regions RX41 through RX44, and the fins may form FinFETs with the gate lines. In the attached drawings hereinafter, for convenience of illustration, the fins on the active regions may be not shown, but it will be understood that the inventive concepts disclosed herein may be applied not only to a cell including a planar transistor but to a cell including a FinFET.

Each of the active regions included in the same row may have a different conductivity type. For example, as shown in FIG. 4, the first row R41 may include the first active region RX41 as an active region of an NFET, and the second active region RX42 as an active region of a PFET. Moreover, an active region may be placed so as to have a conductivity type that is identical to that of an active region in a neighboring row. As such, the second row R42 may include a third active region RX43 as an active region of a PFET and the fourth active region RX44 as an active region of an NFET. Herein, two active regions (for example, the first active region RX41 and the second active region RX42), which are included in the same row and respectively have different conductivity types, may be referred to as an active region pair. On the boundary between the first row R41 and the second row R42, a power line to which a positive supply voltage is applied may extend in the X axis direction, and accordingly, the second active region RX42 and the third active region RX43, which are active regions of a PFET, may be placed to be adjacent to each other. In addition, in some embodiments, as will be described with reference to FIG. 9, the active regions may be divided by a diffusion break near boundaries of the standard cells.

In some embodiments, due to the first cell C41 and the second cell C42 that are placed apart from each other in the Y axis direction, a minimum distance D43 between the active region RX42 of the first cell C41 and the active region RX43 may be greater than a distance D41 between the active regions RX41 and RX42 of the first cell C41 (D43>D41). The minimum distance D43 may also be greater than a minimal distance D42 between the active regions RX43 and RX44 of the second cell C42 (D43>D42). In other words, a distance (for example, the distance D43) between active region pairs adjacent to each other may be greater than a distance (for example, the distance D41 or D42) between the active regions within one of the active region pairs. In contrast, in the integrated circuit 10 shown in FIG. 1 or the integrated circuit 20 shown in FIG. 2, a minimum distance between the active regions included in different rows may be equal to or less than a distance between the active regions included in the same row. In some embodiments, the distance D41 between the first active region RX41 and the second active region RX42 in the first row R41 may be equal to the distance D42 between the third active region RX43 and the fourth active region RX44 in the second row R42.

Figure 5:
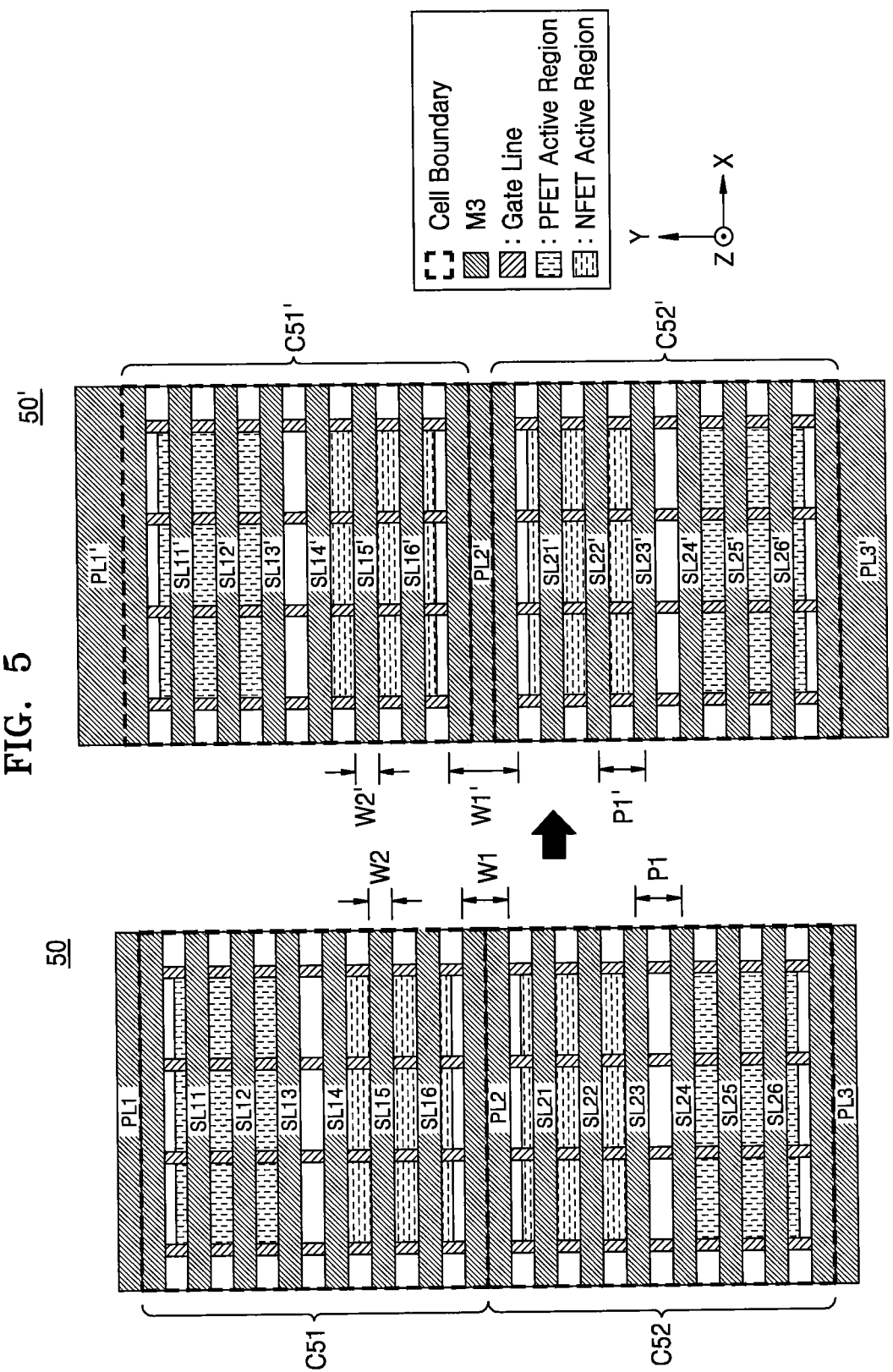
FIG. 5 illustrates top-plan views schematically showing parts of integrated circuits according to example embodiments of the inventive concepts.

FIG. 5 illustrates top plan views schematically showing parts of integrated circuits 50 and 50' according to example embodiments of the inventive concepts. More particularly, the left illustration of FIG. 5 shows an integrated circuit 50 which includes power lines PL1, PL2, and PL3 whose widths are not increased, and the right illustration of FIG. 5 shows an integrated circuit 50' including power lines PL1', PL2', and PL3', whose widths are increased.

Referring to the left image of FIG. 5, a first cell C51 and a second cell C52 may respectively be placed in different rows of the integrated circuit 50 and may include gate lines aligned in the Y axis direction. A second power line PL2 may extend in the X axis direction in an M3 metal layer at a boundary between the first cell C51 and the second cell C52, and a first power line PL1 and a third power line PL3 may extend in the X axis direction in parallel to the second power line PL2 and on opposite sides of the boundary between the first cell C51 and the second cell C52. Between the power lines, signal lines for signal routing may extend in the X axis direction. For example, on the first cell C51, a plurality of signal lines SL11 through SL16 may extend in the X axis direction between the first power line PL1 and the second power line PL2, and on the second cell C52, a plurality of signal lines SL21 through SL26 may extend in the X axis direction between the second power line PL2 and the third power line PL3. The plurality of signal lines between the power lines may have the same width and be apart from one another in a regular pitch, that is, a first pitch P1. In some embodiments, a width of a power line may be greater than a width of a signal line. For example, as shown in the left illustration of FIG. 5, a width W1 of the second power line PL2 may be greater than a width W2 of the signal line SL15.

Referring to the right illustration of FIG. 5, in the integrated circuit 50', a first cell C51' and a second cell C52' may respectively be placed in different rows and include gate lines aligned in the Y axis direction. As shown in broken lines in FIG. 5, the first cell C51' and the second cell C52' of the integrated circuit 50' may be identical to or similar to the first cell C51 and the second cell C52 of the integrated circuit 50. As with the integrated circuit 50, the integrated circuit 50' may include first through third power lines PL1' through PL3' extending in the X axis direction, a plurality of signal lines SL11' through SL16' between the first power line PL1' and the second power line PL2', and a plurality of signal lines SL21' through SL26' between the second power line PL2' and the third power line PL3'.

In some embodiments, the integrated circuit 50' in the right illustration of FIG. 5 may have signal lines each having a width W2' that is identical to or similar to the width W2 of the signal lines of the integrated circuit 50 in the left illustration of FIG. 5 (e.g., W2'=W2), and the signal lines may have a pitch P1' that is identical to the pitch P1 of the signal lines of the integrated circuit 50 shown in the left illustration of FIG. 5 (e.g., P1'=P1). Also, in some embodiments, the integrated circuit 50' in the right illustration of FIG. 5 may have power lines PL1', PL2', and PL3', each having a width W1' that is larger than the width W1 of the power lines PL1, PL2, and PL3 (e.g., W1'>W1) In some embodiments, the width W1' of the power lines PL1', PL2', and PL3' may be greater than a width W2' of the signal lines at least by the first pitch P1' of the signal lines (W1'≥W2'+P1').

Figure 6:
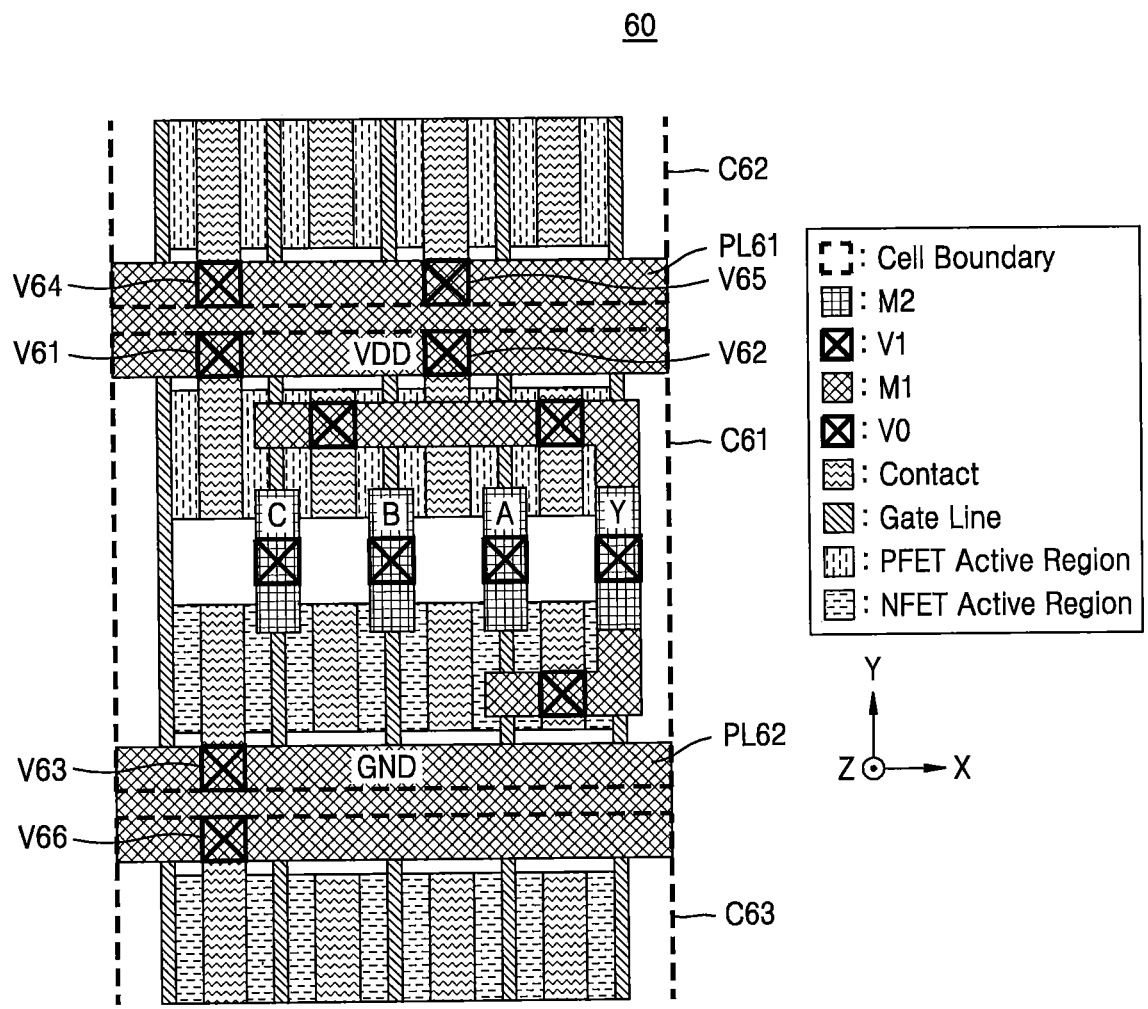
FIG. 6 is a top-plan view illustrating a part of a layout of an integrated circuit according to an example embodiment of the inventive concepts.

FIG. 6 is a top plan view illustrating a part of a layout of an integrated circuit 60 according to an example embodiment. More particularly, FIG. 6 illustrates the integrated circuit 60 including a first cell C61, a second cell C62, and a third cell C63 respectively placed in different rows. Only portions of the second cell C62 and the third cell C63 are shown in FIG. 6. The first cell C61 may function as a 3-input NAND gate having three input signals A, B, and C and an output signal Y. As shown in FIG. 6, the three input signals A, B and C may be received respectively though three patterns in M2 metal layer and the output signal Y may be output though a pattern in the M2 metal layer. For convenience of illustration, FIG. 6 may partially illustrate patterns in each layer.

In some embodiments, a via being connected to a power line and configured to provide a supply voltage to a standard cell may be configured to contact an edge of the power line. For example, as shown in FIG. 6, a first via V61 and a second via V62 may be connected to a first power line PL61 to provide a positive supply voltage VDD to a first cell C61 as a three-input NAND gate, and the first via V61 and the second via V62 may, under the first power line PL61, be disposed at an edge of the first power line PL61. Similarly, a fourth via V64 and a fifth via V65, which may be connected to the first power line PL61 to provide the positive supply voltage VDD to the second cell C62, may also be disposed at an edge of the first power line PL61. In addition, a third via V63, which may be connected to a second power line PL62 to provide a ground voltage GND to the first cell C61, may, under the second power line PL62, be disposed at an edge of the second power line PL62. Similarly, a sixth via V66, which may be connected to the second power line PL62 to provide the ground voltage GND to a third cell C63, may also be disposed at an edge of the second power line PL62.

Vias connected to power lines may be aligned in the Y axis direction to provide power voltages to different standard cells and respectively disposed to contact edges of the power lines that face each other in the Y axis direction. For example, the first via 61 and the fourth via V64, which are used to provide the positive supply voltage VDD to the first cell C61 and the second cell C62, may be aligned in the Y axis direction and aligned respectively at two opposite edges of the first power line PL61. In some embodiments, the first via V61 and the fourth via V64 may be spaced apart from each other in the Y axis direction. In some embodiments, the first via V61 and the fourth via V64 may be integrated into a via, for example, a bar-type via. Similarly, the third via V63 and the sixth via V66, which are used to provide the ground voltage GND to the first cell C61 and the third cell C63, may be aligned in the Y axis direction or disposed respectively at two opposite edges of the second power line PL62.

Figure 7A:
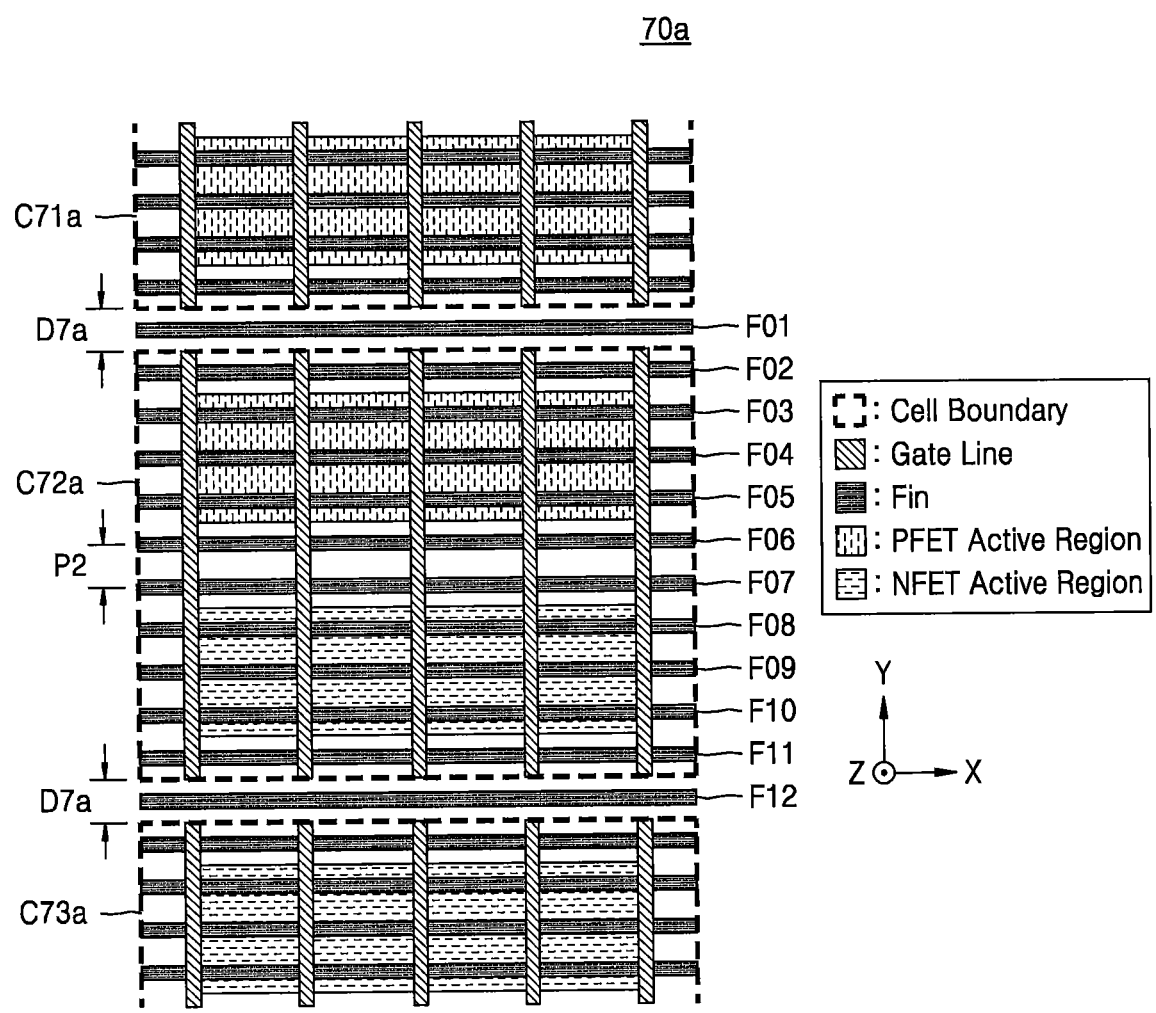
FIGS. 7A and 7B are top-plan views respectively illustrating integrated circuits according to example embodiments of the inventive concepts.
Figure 7B:
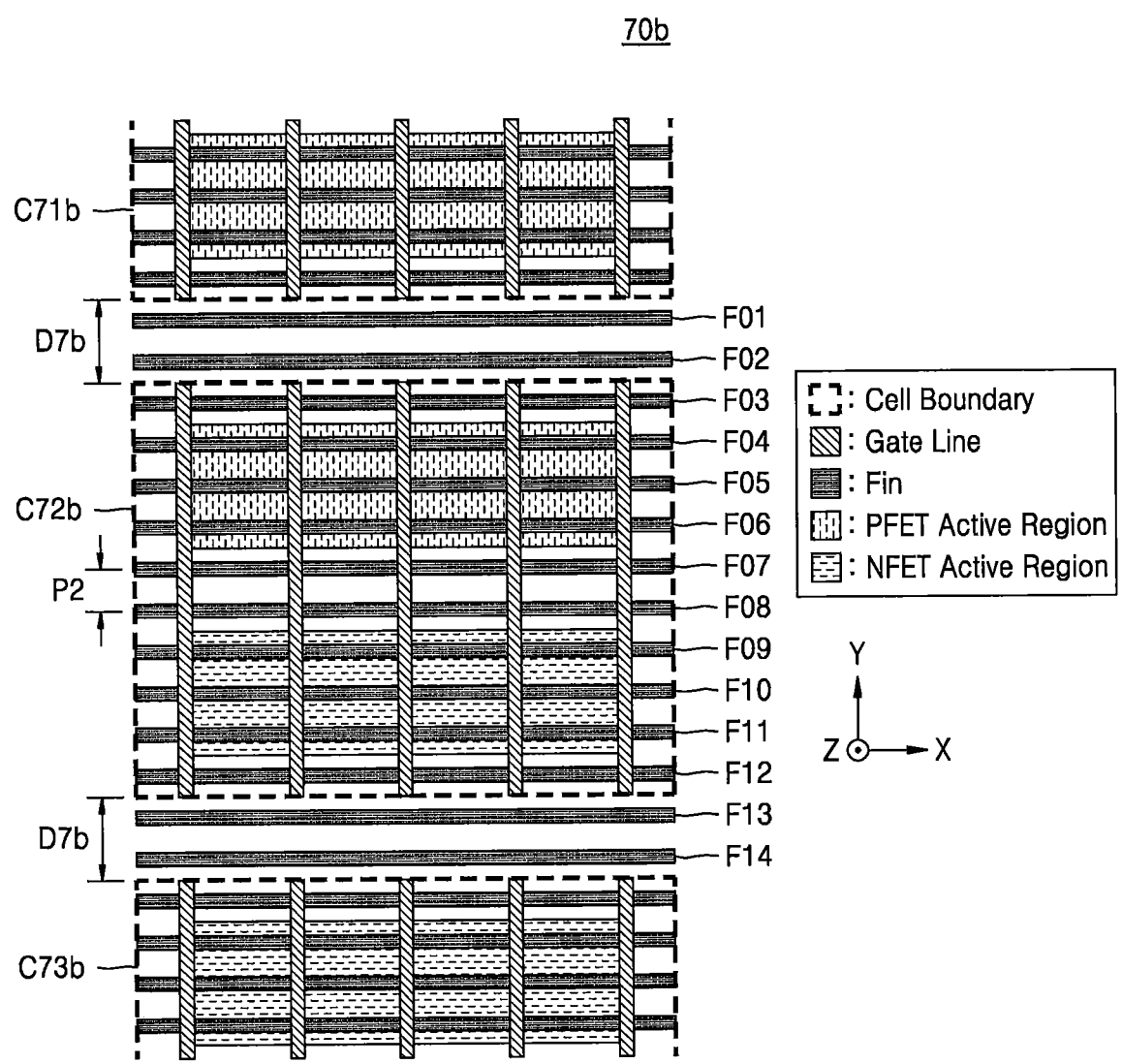

FIGS. 7A and 7B are top plan views of integrated circuits 70a and 70b according to example embodiments. More particularly, FIGS. 7A and 7B illustrate integrated circuits 70a and 70b respectively including standard cells placed apart from one another in the Y axis direction according to a pitch of the fins. Hereinafter, descriptions of concepts or components of FIGS. 7A and 7B which overlap with descriptions of such concepts or components provided elsewhere herein may be omitted.

Referring to FIG. 7A, the integrated circuit 70a may include a first cell C71a and a third cell C73a respectively placed in different rows, and a second cell C72a which may be placed in a row between the first cell C71a and the third cell C73a. In FIG. 7A, only portions of the first cell C71a and the third cell C73a are shown. The integrated circuit 70a may include a plurality of fins extending in the X axis direction, and among the plurality of fins, fins extending on the active region may, together with a gate line, form a transistor, that is, a FinFET. For example, a fin may include a source region/drain region formed at two opposite sides of the gate line. In the second cell C72a, a third fin F03 through a fifth fin F05 may form a PFET together with a gate line extending in the Y axis direction; and an eighth fin F08 through a tenth fin F10 may form an NFET together with a gate line extending in the Y axis direction. Fins that extend in a region between the active regions, for example, a first fin F01 and a sixth fin F06, may be referred to as dummy fins. In the integrated circuit 70a, the plurality of fins may be spaced apart from one another in a regular pitch, that is, a second pitch P2.

In some embodiments, a height of a standard cell and a distance in the Y axis direction between the standard cells may be determined by a pitch of the fins, that is, the second pitch P2. For example, as shown in FIG. 7A, the second cell C72a may include a second fin F02 through an eleventh fin F11 and have a height (that is, a length in the Y axis direction) corresponding to ten times the second pitch P2 (that is, 10*P2). Similarly, as a single height cell, each of the first cell C71a and the third cell C73a, like the second cell C72a, may have a height corresponding to ten times the second pitch P2 (that is, 10*P2). In addition, a distance D7a in which the first cell C71a through the third cell C73a are placed apart from one another in the Y axis direction may be equal to the second pitch P2. Accordingly, a fin, that is, the first fin F01, may be inserted between the first cell C71a and the second cell C72a, and a fin, that is, the twelfth fin F12, may be inserted between the second cell C72a and the third cell C73a. Accordingly, compared to the case in which the first C71a through the third cell C73a contact one another in the Y direction, for example as in the integrated circuit 10 shown in FIG. 1, a power line may have a width increased by the pitch of the fins, that is, the second pitch P2.

Referring to FIG. 7B, the integrated circuit 70b may include a first cell C71b, a second cell C72b, and a third cell C73b respectively placed in different rows. The second cell C72b may be placed in a row between the first cell C71b and the third cell C73b. In FIG. 7B, only portions of the first cell C71b and the third cell C73b are shown. The plurality of fins extending in the X axis direction may be spaced apart from one another in a regular pitch, that is, the second pitch P2. Similarly to the integrated circuit 70a shown in FIG. 7A, in the integrated circuit 70b shown in FIG. 7B, a height of the first cell C71b through the third cell C73b may be identical to a multiple of the second pitch P2 (that is, 10*P2). A distance D7b in which the first cell C71b through the third cell C73b are placed apart from one another in the Y axis direction may be a multiple of the second pitch P2 (that is, 2*P2).

The first cell C71b through the third cell C73b in the integrated circuit 70b in FIG. 7B, as compared with the first cell C71a through the third cell C73a in the integrated circuit 70a in FIG. 7A, may be placed further from one another in the Y axis direction. As shown in FIG. 7B, the distance D7b, in which the first cell C71b through the third cells C73b are spaced apart from one another in the Y axis direction, may correspond to twice the second pitch P2. Accordingly, two fins, that is, the first fin F01 and the second fin F02, may be inserted between the first cell C71b and the second cell C72b, and two fins, that is, a thirteenth fin F13 and a fourteenth fin F14, may be inserted between the second cell C72b and the third cell C73b. Accordingly, as compared to the case in which the first cell C71b through the third cell C73b contact one another in the Y axis direction, for example as in the integrated circuit 10 shown in FIG. 1, a power line may have a width increased by twice a pitch of the fins, that is, twice the second pitch P2. Although it is not shown, it will be understood to one of ordinary skill in the art that in some embodiments standard cells may be placed apart from one another in the Y axis direction by at least three times the second pitch P2.

Figure 8A:
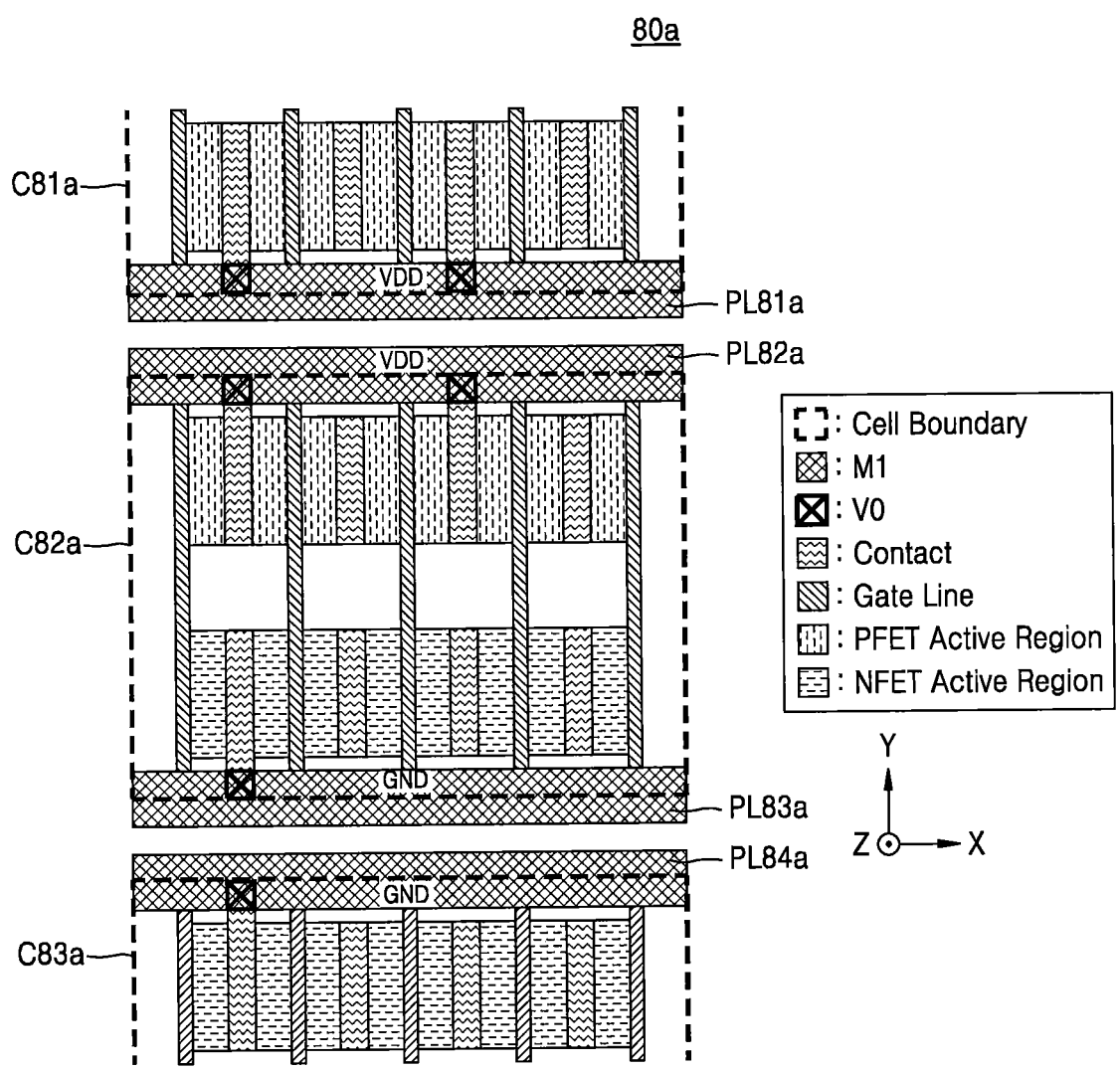
FIGS. 8A and 8B are top-plan views respectively showing integrated circuits according to example embodiments of the inventive concepts.
Figure 8B:
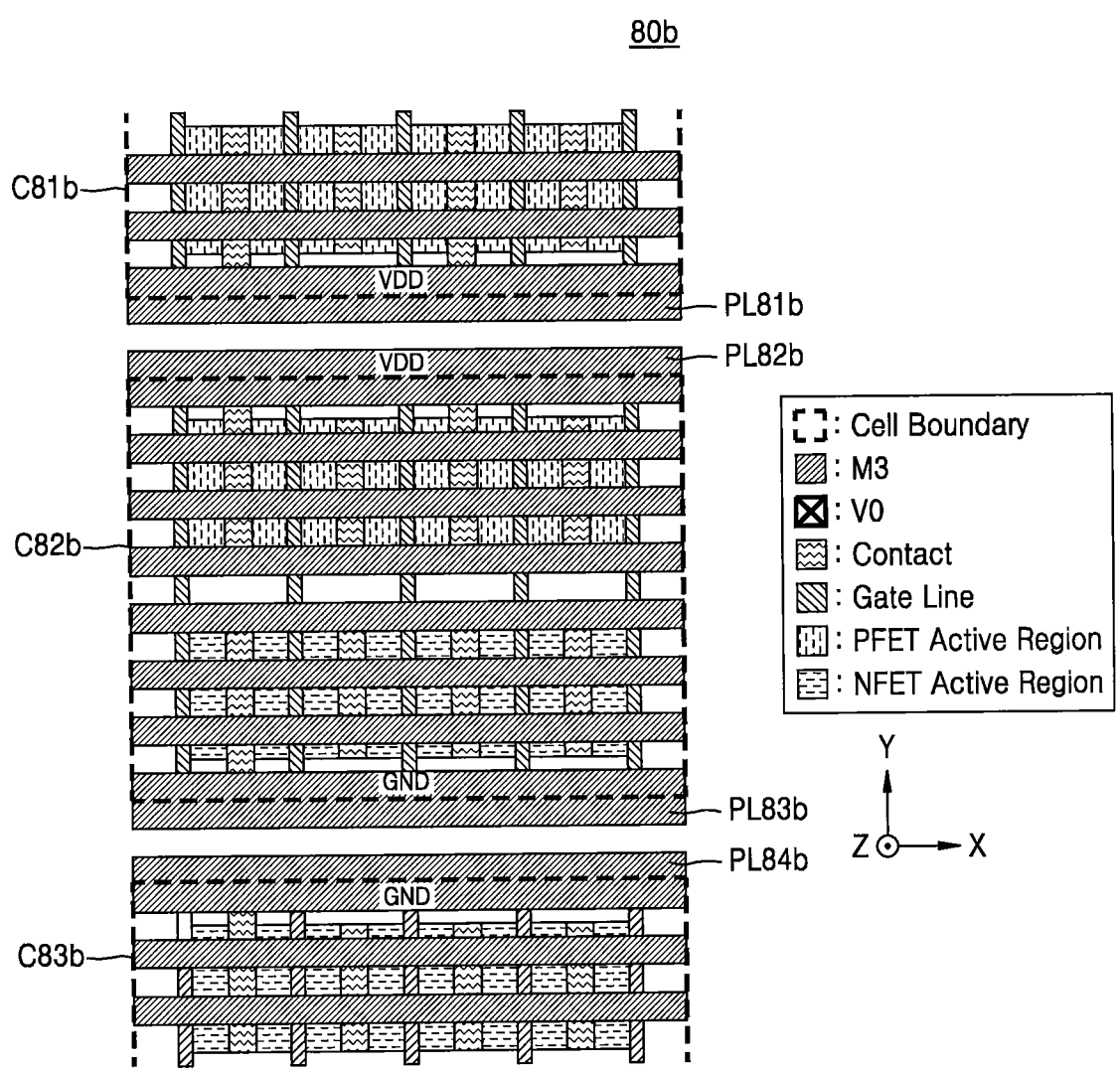

FIGS. 8A and 8B are top plan views respectively showing integrated circuits 80a and 80b according to example embodiments. More particularly, FIGS. 8A and 8B illustrate integrated circuits 80a and 80b, each providing a same supply voltage, and each providing two power lines adjacent to each other. Hereinafter, descriptions of concepts or components illustrated in FIGS. 8A and 8B which overlap with descriptions of such concepts or components provided elsewhere herein may be omitted. For convenience of illustration, some patterns in each layer may be omitted in FIGS. 8A and 8B.

Referring to FIG. 8A, the integrated circuit 80a may include a first cell C81a, a second cell C82a, and a third cell C83a respectively placed in different rows. The second cell C82a may be placed in a row between the first cell C81a and the third cell C83a. As described herein, to enhance power integrity, the first cell C81a through the third cell C83a may be placed apart from one another in the Y axis direction.

In some embodiments, at least two power lines may be formed in an M1 metal layer in a region which is secured as the standard cells are placed apart from one another in the Y axis direction. For example, as shown in FIG. 8A, the first cell C81a and the second cell C82a may be placed apart from each other in the Y axis direction, and a first power line PL81a and a second power line PL82a, which may provide the positive supply voltage VDD respectively to the first cell C81a and the second cell C82a, may extend in the X axis direction. In some embodiments, the first power line PL81a and the second power line PL82a may be electrically connected to a metal layer above the M1 metal layer or an upper metal layer of the M1 metal layer, for example, a power line formed in the M3 metal layer. In addition, the second cell C82a and the third cell C83 may be spaced apart from each other in the Y direction and a third power line PL83a and a fourth power line PL84a, which respectively provide the ground voltage GND to the second cell C82a and the third cell C83a, may extend in the X axis direction. In some embodiments, the third power line PL83a and the fourth power line PL84a may be electrically connected to each other by a metal layer above the M1 metal layer or by an upper metal layer of the M1 metal layer, for example, a power line formed in the M3 metal layer.

Referring to FIG. 8B, the integrated circuit 80b may include a first cell C81b, a second cell C82b, and a third cell C83b respectively placed in different rows. The second cell C82b may be placed in a row between the first cell C81b and the third cell C83b. To enhance power integrity, the first cell C81b through the third cell C83b may be placed apart from one another in the Y axis direction, as described herein.

In some embodiments, as the standard cells are placed apart from one another in the Y axis direction, at least two power lines may be formed in a metal layer above the M1 metal layer or in the upper metal layer of the M1 metal layer, for example, the M3 metal layer. For example, as it is shown in FIG. 8B, the first cell C81b and the second cell C82b may be placed apart from each other in the Y axis direction, and the first power line PL81b and the second power line PL82b, which may provide the positive supply voltage VDD respectively to the first cell C81b and the second cell C82b, may extend in the X axis direction. In some embodiments, the first power line PL81b and the second power line PL82b may be electrically connected to each other by a power line formed in a metal layer below the M3 metal layer or a lower metal layer of the M3 metal layer, for example, the M1 metal layer, and in other examples, the first power line PL81b and the second power line PL82b may be electrically connected to each other by a power line formed in a metal layer above the M3 metal layer or an upper metal layer of the M3 metal layer. In addition, the second cell C82b and the third cell C83b may be placed apart from each other in the Y axis direction and the third power line PL83b and the fourth power line PL84b, which may provide the ground voltage GND respectively to the second cell C82b and the third cell C83b, may extend in the X axis direction. In some embodiments, the third power line PL83b and the fourth power line PL84b may be electrically connected to each other by the power line formed in the metal layer below the M3 metal layer or the lower layer of the M3 metal layer, for example, the power line formed in the M1 metal layer, and in other embodiments, the third power line PL83b and the fourth power line PL84b may be electrically connected to each other by the power line formed in the metal layer above the M3 metal layer or the upper metal layer of the M3 metal layer.

Figure 9:
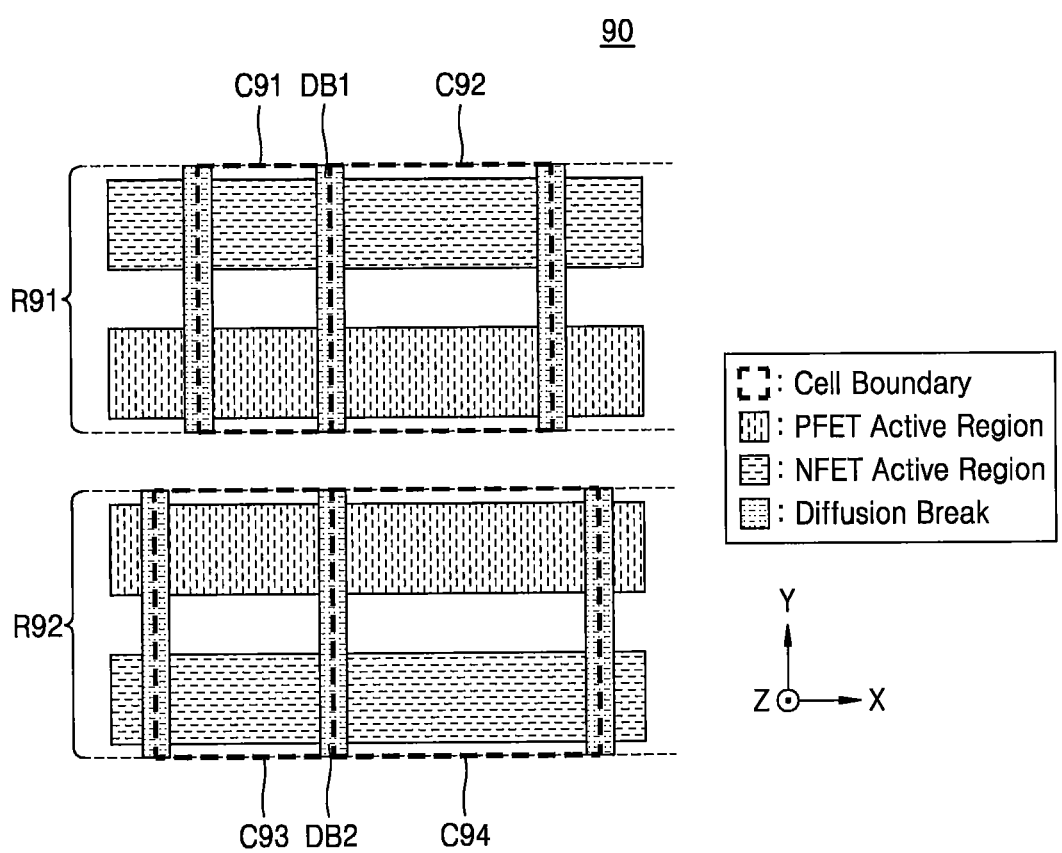
FIG. 9 is a top-plan view illustrating an integrated circuit according to an example embodiment of the inventive concepts.

FIG. 9 is a top plan view illustrating an integrated circuit according to an example embodiment. In detail, FIG. 9 illustrates an integrated circuit 90 including diffusion breaks at boundaries between the standard cells.

In some embodiments, a diffusion break may be inserted to reduce the effects between neighboring cells, that is, local layout effect (LLE). For example, the diffusion break may isolate a diffusion region from the cells adjacent thereto or isolate fins from the cells adjacent thereto. In some embodiments, the diffusion break may isolate the diffusion region and/or the fins from among the cells adjacent thereto by eliminating at least some of the diffusion region and/or the active region, and may be filled with an insulator. In some embodiments, a diffusion break may also be referred to as an shallow trench isolation (STI).

A diffusion break may include a double diffusion break (DDB) and a single diffusion break (SDB). The DDB may, in a region between the gate lines, have a length in the X axis direction of 1 contacted poly pitch (CPP) or greater. The DDB may be formed by etching the active region and may also be formed by further etching a part of a substrate below the active region. A gate line on the DDB may be referred to as a dummy gate line. On the other hand, the SDB may have a width (that is, a length in the X axis direction) that is nearly identical to a width of the gate line and be formed by etching the active region in the region where the gate line is disposed.

Referring to FIG. 9, the integrated circuit 90 may include a first cell C91 and a second cell C92 placed in a first row R91, and a third cell C93 and a fourth cell C94 placed in a second row R92. A first diffusion break DB1 extending in the Y axis direction, which may be formed at a boundary between the first cell C91 and the second cell C92, may be a DDB or a SDB. Similarly, a second diffusion break DB2 extending in the Y axis direction, which may be formed at a boundary between the third cell C93 and the fourth cell C94, may be a DDB or a SDB.

In some embodiments, diffusion breaks respectively formed in different rows may not be connected to one another. That is, as shown in FIG. 9, the diffusion break (or STI) may not be formed in a region between the first row R91 and the second row R92. Accordingly, as the boundary between the first cell C91 and the second cell C92 and the boundary between the third cell C93 and the fourth cell C94 are aligned in the Y axis direction, when the first diffusion break DB1 and the second diffusion break DB2 are aligned in the Y axis direction, the first diffusion break DB1 and the second diffusion break DB2 may be disposed apart from each other in the Y axis direction.

Figure 10:
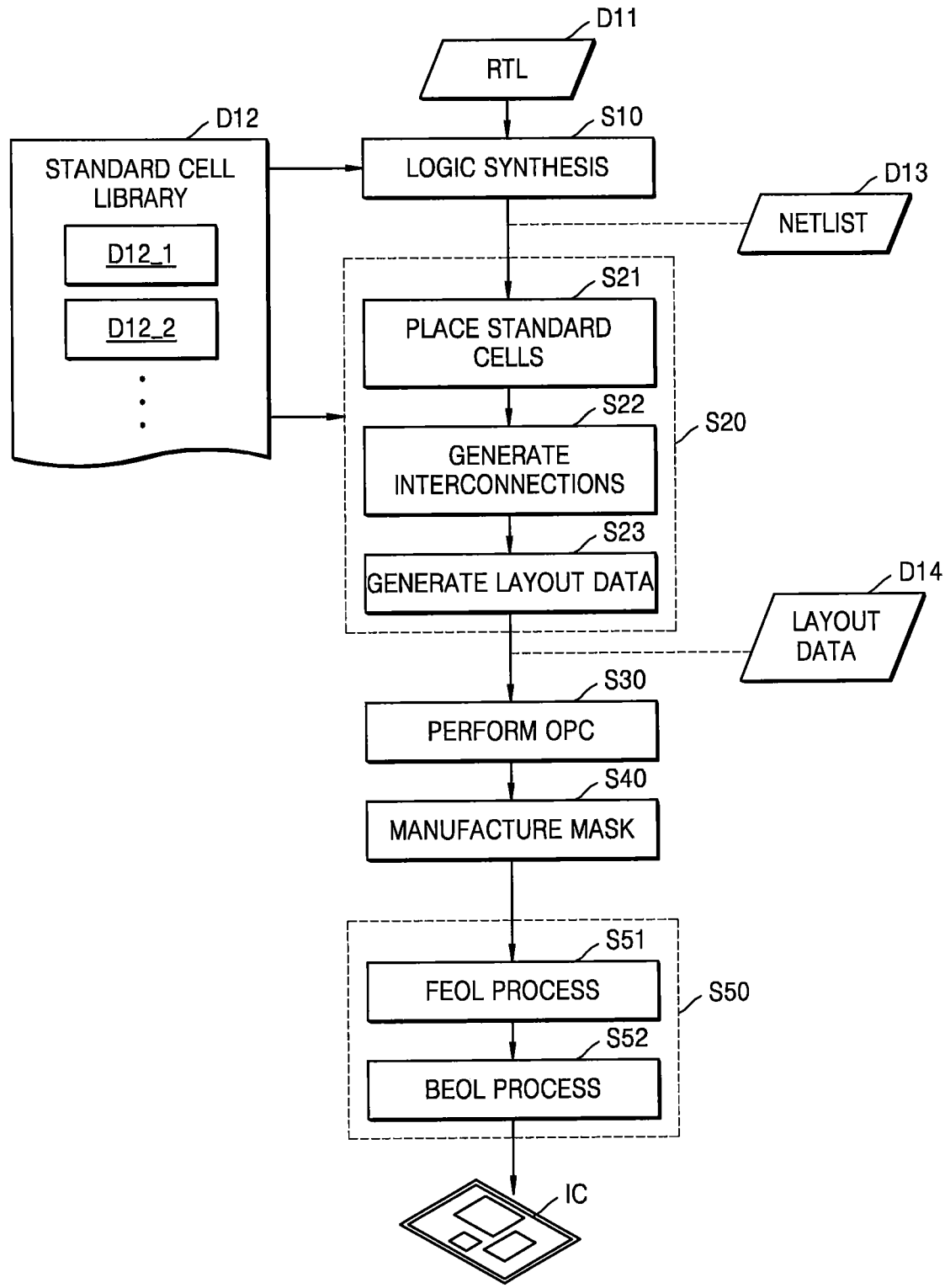
FIG. 10 is a flowchart for describing a method of manufacturing an integrated circuit, according to an example embodiment of the inventive concepts.

FIG. 10 is a flowchart of a method of manufacturing an integrated circuit, according to an example embodiment.

A standard cell library (or a cell library) D12 may include information regarding the standard cells, for example, function information, characteristics information, and layout information. As shown in FIG. 10, the standard cell library D12 may include data D12_1 and D12_2 each defining a layout of the standard cells. In some embodiments, the first data D12_1 may define layouts of standard cells which are defined by power lines that do not have an enlarged width, for example, the first cell C11 through the ninth cell C19 shown in FIG. 1, and in other embodiments, the second data D12_2 may define layouts of standard cells having an increased height according to the power lines having an enlarged width, for example, the first cell C31a through the sixth cell C36a shown in FIG. 3A. In some embodiments, the standard cell library D12 may include only one of the first data D12_1 and the second data D12_2.

In operation S10, a logic synthesis process may be performed to generate netlist data D13 from RTL data D11. For example, a semiconductor design tool (for example, a logic synthesis tool) may perform logic synthesis with reference to the standard cell library D12 from the RTL data made in a hardware description language (HDL) such as a VHSIC Hardware Description Language (VHDL) or Verilog to generate the netlist data D13 including a bit stream or a netlist. The standard cell library D12 may include information regarding the standard cells having improved performance due to the power lines having enlarged width, and in the logic synthesis process, with reference to the information, the standard cells may be included in the integrated circuit.

In operation S20, a place & routing (P&R) operation may be performed to generate the layout data D14 from the netlist data D13. As shown in FIG. 10, the P&R operation S20 may include a plurality of operations S21, S22, and S23.

In operation S21, the standard cells may be placed. For example, a semiconductor design tool, for example, a P&R tool, may place a plurality of standard cells with reference to the standard cell library D12 from the netlist data D13. As described above with reference to the drawings, the plurality of standard cells may be placed such that the power lines having enlarged width are formed. In some embodiments, when the standard cell library D12 includes the second data D12_2 that defines layouts of the standard cells having increased heights according to the power lines having enlarged widths, like the first cell C31a through the sixth cell C36a in FIG. 3A, the P&R tool may place the standard cells defined by the second data D12_2. On the other hand, in some embodiments, when the standard cell library D12 includes the first data D12_1 that defines layouts of the standard cells that are defined by power lines not having enlarged widths, like the first cell C11 through the ninth cell C19 shown in FIG. 1, the P&R tool may place the standard cells in various ways, and some examples thereof will be described hereinafter with reference to FIGS. 11A and 11B.

In operation S22, interconnections may be formed. An interconnection may electrically connect an output pin and an input pin of a standard cell to each other, and may, for example, include at least one via and at least one conductive pattern. As described above with reference to FIGS. 1, 2, and the like, as the standard cells are placed apart from one another in the Y axis direction, spaces for signal routing may be maintained, and accordingly, routing congestion, which occurs due to the power line having an enlarged width, may not occur.

In operation S23, the layout data D14 may be generated. The layout data D14 may have a format such as Geometric Data Stream II (GDSII) and include geometric information regarding the standard cells and the interconnections.

In operation S30, an optical proximity correction (OPC) operation may be performed. An OPC operation may refer to a process of forming a pattern having a desired shape by calibrating distortion such as refraction that occurs due to characteristics of light in a photolithography process included in a semiconductor process of manufacturing an integrated circuit, and as the OPC is applied to the layout data D14, a pattern for the mask may be determined. In some embodiments, the layout of the integrated circuit may be limitedly modified in operation S30, and in operation S30, to limitedly modify the layout of the integrated circuit, which is a post process to optimize the structure of the IC, may also be referred to as a design polishing process.

In operation S40, a mask may be manufactured. For example, as the OPC is applied to the layout data D14, patterns on the mask may be defined to form the patterns formed on the plurality of layers, and at least one mask (or a photomask) may be manufactured for forming patterns for each of the plurality of layers.

In operation S50, an integrated circuit may be fabricated. For example, the integrated circuit may be fabricated by patterning a plurality of layers by using the at least one mask that is manufactured in operation S40. As shown in FIG. 10, operation S50 may include operations S51 and S52.

A front-end-of-line (FEOL) process may be performed in operation S51. The FEOL may refer to a process of forming individual devices, for example, a transistor, a capacitor, and/or a resistor, in a process of fabricating the integrated circuit. For example, the FEOL may include planarizing and cleaning a wafer, forming a trench, forming a well, forming a gate line, and forming a source and a drain.

A back-end-of-line (BEOL) process may be performed in operation S52. The BEOL may refer to a process of connecting individual devices, for example, a transistor, a capacitor, and a resistor, in the process of fabricating the integrated circuit. For example, the BEOL may include siliciding a gate, a source region, and a drain region, adding a dielectric material, planarizing, forming a hole, adding a metal layer, forming a via, forming a passivation layer, and the like. Thereafter, the integrated circuit may be packaged into a semiconductor package and used as a member of various applications.

Figure 11A:
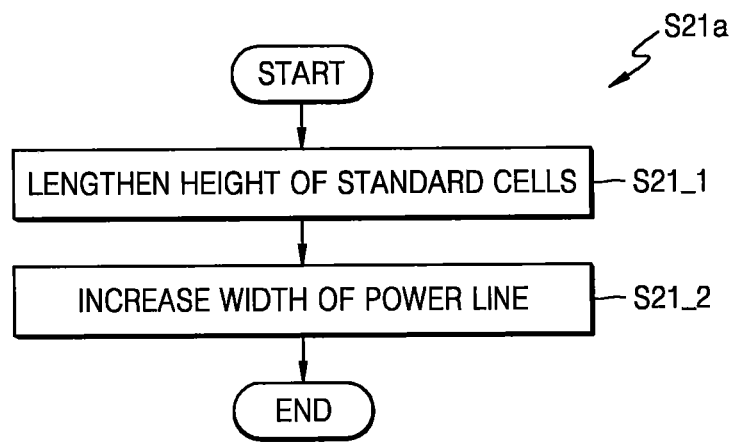
FIGS. 11A and 11B are flowcharts respectively showing examples of operation S21 shown in FIG. 10.
Figure 11B:
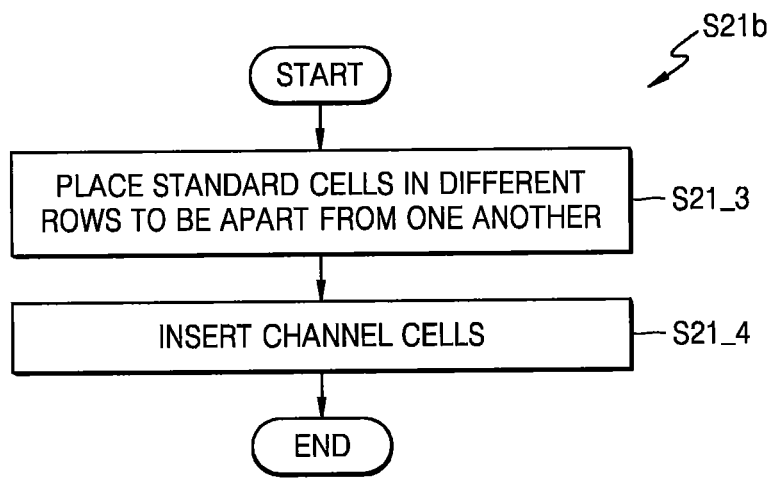

FIGS. 11A and 11B are flowcharts of examples of operation S21 shown in FIG. 10. In detail, FIGS. 11A and 11B respectively illustrate examples S21a and S21b in which the standard library D12 shown in FIG. 10 includes the second data D12_2 that defines the layouts of the standard cells having the increased height according to the power lines having an enlarged width, for example, the first cell C31a through the sixth cell C36a shown in FIG. 3A, and placing the standard cells based on the second data D12_2. Although layouts of the integrated circuit are formed in different methods in FIGS. 11A and 11B, as operations S21a and S21b are performed, layouts of the ICs may be identical to each other. Hereinafter, FIGS. 11A and 11B will be described with reference to FIGS. 3A, 3B, and 10.

Referring to FIG. 11A, operation S21a may include operation S21_1 and operation S21_2. In operation S21_1, heights of the standard cells may be increased. For example, as shown in FIG. 3A, the P&R tool may increase the height of the standard cells defined by the first data D12_1 of the standard cell library D12 based on the enlarged widths of the power lines to generate the standard cells (for example, the first cell C31a shown in FIG. 3A) each having an increased height. In some embodiments, the P&R tool may increase the heights of the standard cells by uniformly enlarging only the boundaries of the standard cells in the Y axis direction, and as a result, the standard cells having the increased heights may have a structure that is identical to a former structure of the standard cells. As described above with reference to FIGS. 7A and 7B, in some embodiments, the width of the power lines may be increased according to the second pitch P2 of the fins, and as a result, the P&R tool may also increase the heights of the standard cells, according to the second pitch P2.

In operation S21_2, a width of a power line may be increased. A layout of a standard cell defined in the standard cell library D12 may define power lines outside the boundaries of the standard cells, and after the standard cells are placed, the power lines that are defined by the standard cells adjacent to one another may be shared as one same power line. Accordingly, in operation S21_2, a width of a power line defined by the standard cell may be increased, an operation of placing the standard cells that define a power line with an enlarged width may be performed after operation S21_2, and thereafter, the power lines having the enlarged width and defined by the standard cells adjacent to one another may be shared as one same power line. As described above, in some embodiments, the width of the power lines may be increased according to the second pitch P2 of the fins.

Referring to FIG. 11B, operation S21b may include operation S21_3 and operation S21_4. In operation S21_3, standard cells in different rows may be placed apart from one another. For example, as shown in FIG. 3B, the standard cells (for example, the first cell C31b shown in FIG. 3B) defined by the first data D12_1 of the standard cell library D12 may be placed apart from one another in the Y axis direction. Accordingly, when a power line having an enlarged width is disposed, the IC may maintain the structure of the existing standard cell.

In operation S21_4, channel cells may be inserted between rows in which the standard cells are placed. For example, as described above with reference to FIG. 3B, the channel cells may be inserted between the rows in which the standard cells are placed, and the channel cells may include at least a part of the power lines having enlarged widths.

Figure 12:
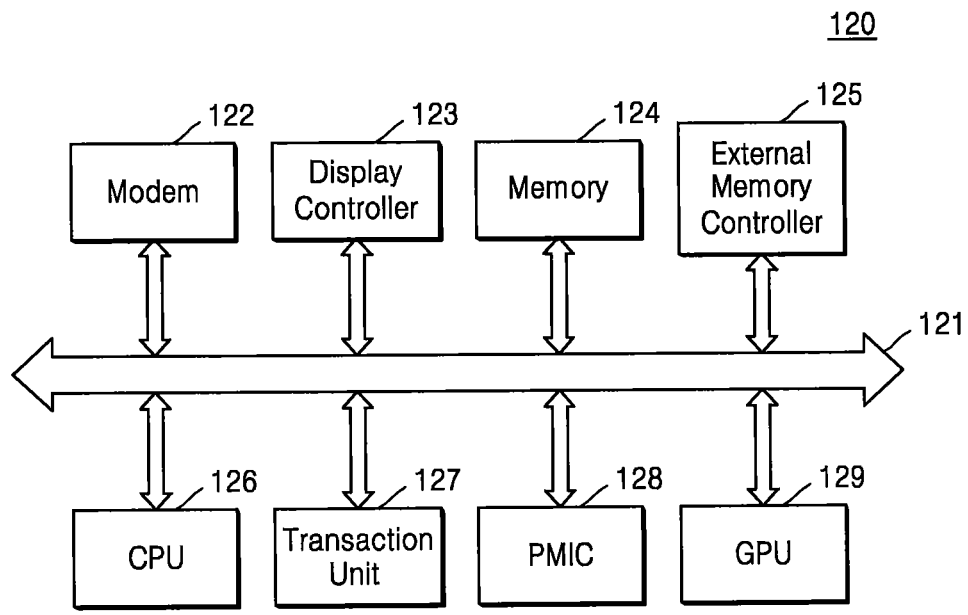
FIG. 12 is a block diagram illustrating a system on chip (SoC) according to an example embodiment of the inventive concepts.

FIG. 12 is a block diagram illustrating a system on chip (SoC) 120 according to an example embodiment. The SoC 120, which is a semiconductor device, may include an integrated circuit according to an example embodiment of the inventive concepts. In the SoC 120, complex functional blocks (for example, an intellectual property (IP)) for performing various functions may be embodied in a single chip. According to example embodiments of the inventive concepts, power lines having an enlarged width may be included in each function block of the SoC 120, and as a result, the SoC 120 that is capable of providing improved performance and operation reliability and reduces time to market may be manufactured.

Referring to FIG. 12, the SoC 120 may include a modem 122, a display controller 123, a memory 124, an external memory controller 125, a central processing unit (CPU) 126, a transaction unit 127, a power management integrated circuit (PMIC) 128, and a graphic processing unit (GPU) 129, and each function blocks in the SoC 120 may communicate each other via a system bus 121.

The CPU 126, which may control overall operations of the SoC 120, may also control operations of the modem 122, the display controller 123, the memory 124, the external memory controller 125, the transaction unit 127, the PMIC 128, and the GPU 129. The modem 122 may demodulate signals received from outside of the SoC 120 or modulate signals generated in the SoC 120 and transmit the signals to the outside. The external memory controller 125 may control transmitting data to or receiving data from an external memory device connected to the SoC 120. For example, a program and/or data stored in the external memory device may, under control of the external memory controller 125, be provided to the CPU 126 and/or the GPU 129. The GPU 129 may execute program instructions related to graphic processing. The GPU 129 may receive graphic data via the external memory controller 125 and may transmit the graphic data, that is processed by the GPU 129, to the outside of the SoC 120 via the external memory controller 125. The transaction unit 127 may monitor data transaction between the function blocks, and the PMIC 128 may, under control by the transaction unit 127, control power supplied to the function blocks. The display controller 123 may, by controlling a display (or a display device) at the outside of the SoC 120, transmit data generated in the SoC 120 to the display.

The memory 124 may include non-volatile memory such as Electrically Erasable Programmable Read-Only Memory (EEPROM), flash memory, Phase-change Random Access Memory (PRAM), Resistive Random Access Memory (RRAM), Nanofloating Gate memory (NFGM), Polymer Random Access Memory (PoRAM), Magnetic Random Access Memory (MRAM), Ferroelectric Random Access Memory (FRAM), and may include volatile memory such as Dynamic Random Access Memory (DRAM), Static Random Access Memory (SRAM), mobile DRAM, Double Data Rate Synchronous Dynamic Random Access Memory (DDR SDRAM), Lo w Power DDR (LPDDR) SDRAM, Graphic DDR (GDDR) SDRAM, Rambus Dynamic Random Access Memory (RDRAM).

Figure 13:
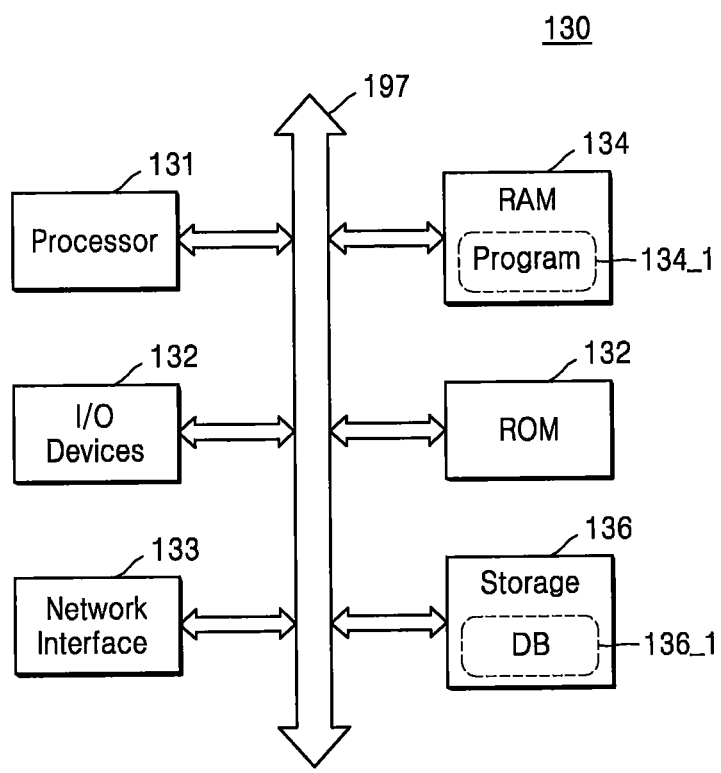
FIG. 13 is a block diagram illustrating a computing system including a memory for storing a program according to an example embodiment of the inventive concepts.

FIG. 13 is a block diagram illustrating a computing system 130 including a memory for storing a program according to an example embodiment. At least a part of processes included in a method (for example, the method described with reference to FIG. 10) for manufacturing the IC, according to example embodiments of the inventive concepts, may be performed in the computing system 130.

The computing system 130 may be a fixed computing system such as a desktop computer, a workstation, a server, or a portable computing system such as a laptop computer. As shown in FIG. 13, the computing system 130 may include a processor 131, I/O devices 132, a network interface 133, random access memory (RAM) 134, read-only memory (ROM) 135, and a storage 136. The processor 123, the I/O devices 132, the network interface 133, the RAM 134, the ROM 135, and the storage 136 may be connected to the bus 137 and may communicate with one another via the bus 137.

The processor 131, which may also be referred to as a processing unit, may include at least one core capable of executing an arbitrary instruction set (for example, Intel Architecture (IA)-32, 64-bit extension IA-32, x86-64, Power PC, Sparc, MIPS, ARM, IA-64, and the like) like a microprocessor, an application processor (AP), a digital signal processor (DSP), a graphic processing unit (GPU). For example, the processor 131 may access the memory, that is, the RAM 134 or the ROM 135, via the bus 137 and may execute the instructions in the RAM 134 or the ROM 135.

The RAM 134 may store a program for manufacturing an integrated circuit according to an example embodiment, or may store a part of the program, and the program 134_1 may cause the processor 131 perform at least some of the operations included in a method (for example, the method described with reference to FIG. 10) of manufacturing the integrated circuit. That is, the program 134_1 may include a plurality of instructions that may be executed by the processor 131, and the plurality of instructions included in the program 134_1 may cause the processor 131 perform, for example, with reference to FIGS. 10, 11A, and 11B, at least some of the operations included in the aforementioned flowcharts.

Data stored in the storage 136 may not be erased when power is no longer provided thereto, such as when the computing system 130 is out of power supply. For example, the storage 136 may include a non-volatile memory device or a storage medium such as a magnetic tape, an optical disk, and a magnetic disk. In addition, the storage 136 may be attachable to/detachable from the computing system 130. The storage 136 may also store the program 134_1 according to an example embodiment, and before the program 134_1 is executed by the processor 131, the program 134_1 or at least a part thereof may be loaded from the storage 136 to the RAM 134. Alternatively, the storage 136 may store a file that is made by using a program language, and the program 134_1 may be generated therefrom by a compiler, or the like, or at least a part of the program 134_1 may be loaded from the file to the RAM 134. Also, as shown in FIG. 13, the storage 136 may store the database 136_1 that includes information required for designing the integrated circuit, for example, the standard cell library D12 shown in FIG. 10.

The storage 136 may also store data to be processed/that has been processed by the processor 131. In other words, the processor 131 may, according to the program 134_1, generate data by processing the data stored in the storage 136 and store the generated data in the storage 136. For example, the storage 136 may store the RTL data D11, the netlist data D13, and/or the layout data D14 described with reference to FIG. 10.

The I/O devices 132 may include an input device such as a keyboard, a pointing apparatus, and an output device such as a display apparatus, and a printer. For example, by using the I/O devices 132, the user may trigger execution of the program 134_1 by using the processor 131, input the RTL data D11 and/or the netlist data D13 of FIG. 10, and confirm the layout data D14 of FIG. 10.

The network interface 133 may provide access to a network at outside of the computing system 130. For example, the network may include a plurality of computing systems and communication links, and the communication links may include wired links, optical links, wireless links, or links of other arbitrary forms.

As shown above, example embodiments have been disclosed in the drawings and the specification. Although the embodiments are described by using particular terms, the descriptions are used for explaining the technical idea of the inventive concepts and not for limiting the scope of the inventive concepts recited in the claims. Accordingly, it will be understood by those of ordinary skill in the art that various changes in form and details may be made therein. Therefore, the scope of the present disclosure is defined not by the description of the present disclosure but by the appended claims.

What is claimed is:

1. An integrated circuit comprising:
a first standard cell comprising first and second active regions extending in a first horizontal direction and a first gate line extending in a second horizontal direction orthogonal to the first horizontal direction; and
a second standard cell comprising third and fourth active regions extending in the first horizontal direction and a second gate line aligned with the first gate line in the second horizontal direction and adjacent to the first standard cell,
wherein the second active region and the third active region are adjacent to each other, wherein a distance between the second active region and the third active region is greater than a distance between the first and second active regions, and wherein the distance between the second active region and the third active region is greater than a distance between the third and fourth active regions.

2. The integrated circuit of claim 1, further comprising a power line extending in the first horizontal direction in a conductive layer over a region between the second active region and the third active region, wherein the power line is configured to provide a supply voltage to the first standard cell and the second standard cell.

3. The integrated circuit of claim 2, further comprising a plurality of signal lines, in the conductive layer, wherein the plurality of signal lines are spaced apart from one another in the second horizontal direction by a first pitch and extend in the first horizontal direction, and wherein a width of the power line is greater than a width of the signal line at least by the first pitch.

4. The integrated circuit of claim 2, wherein the first standard cell comprises a first via configured to provide the supply voltage to the first standard cell and arranged at a first edge of the power line, and wherein the second standard cell comprises a second via configured to provide the supply voltage to the second standard cell and arranged at a second edge of the power line that faces the first edge of the power line.

5. The integrated circuit of claim 1, further comprising a first power line and a second power line spaced apart from each other and respectively extending in the first horizontal direction in a conductive layer over a region between the second active region and the third active region, wherein the first power line and the second power line are respectively configured to provide a supply voltage to the first standard cell and the second standard cell.

6. The integrated circuit of claim 1, further comprising a plurality of fins extending in the first horizontal direction, wherein the plurality of fins are spaced apart from one another by a second pitch in the second horizontal direction, and wherein a distance in the second horizontal direction between the first standard cell and the second standard cell is zero or a multiple of the second pitch.

7. The integrated circuit of claim 1, wherein the first and second active regions are terminated by a first diffusion break, wherein the third and fourth active regions are terminated by a second diffusion break aligned to the first diffusion break in the second horizontal direction, and wherein the first diffusion break and the second diffusion break are separated in the second horizontal direction.

8. An integrated circuit comprising a plurality of standard cells, the integrated circuit comprising:
a plurality of active region pairs, each active region pair comprising a first active region of a first conductive type and a second active region of a second conductive type extending in a first horizontal direction, wherein the first active region and the second active region of each active region pair are adjacent to each other; and
a plurality of gate lines extending in a second horizontal direction that is orthogonal to the first horizontal direction, wherein the plurality of active region pairs comprises a first active region pair and a second active region pair arranged adjacent to each other such that a distance between the first and second active region pairs is greater than a distance between the first active region and the second active region in the first active region pair.

9. The integrated circuit of claim 8, further comprising a plurality of power lines extending in the first horizontal direction in a conductive layer over regions between the plurality of active region pairs and configured to provide a supply voltage to the plurality of standard cells.

10. The integrated circuit of claim 9, further comprising a plurality of signal lines, arranged among the plurality of power lines in the conductive layer, wherein the plurality of signal lines are spaced apart from one another by a first pitch in the second horizontal direction and extend in the first horizontal direction, and wherein a width of each power line is greater than a width of the signal lines at least by the first pitch.

11. The integrated circuit of claim 9, further comprising:
a first via configured to provide a supply voltage to an active region adjacent to a first edge of a first power line of the plurality of power lines and arranged at the first edge; and
a second via configured to provide the supply voltage to an active region adjacent to a second edge of the first power line that faces the first edge of the first power line and arranged at the second edge.

12. The integrated circuit of claim 8, further comprising a first power line and a second power line respectively extending in the first horizontal direction in a conductive layer over a region between the first and second active region pairs, wherein the first power line and the second power line are spaced apart from each other, and wherein the first and second power line are configured to respectively provide supply power to different active regions.

13. The integrated circuit of claim 8, further comprising a plurality of fins extending in the first horizontal direction and spaced apart from one another by a second pitch in the second horizontal direction, wherein a pitch of the plurality of active region pairs is a multiple of the second pitch.

14. An integrated circuit comprising a plurality of standard cells aligned in a plurality of rows, the integrated circuit comprising:
first and second active regions extending in parallel in a first horizontal direction in a first row; and
third and fourth active regions extending in parallel in the first horizontal direction in a second row adjacent to the first row,
wherein the second active region and the third active region are adjacent to each other, and wherein a distance between the second active region and the third active region is greater than a distance between the first and second active regions, and greater than a distance between the third and fourth active regions.

15. The integrated circuit of claim 14, further comprising a power line extending in the first horizontal direction in a conductive layer at a boundary between the first row and the second row and configured to provide a supply voltage to standard cells placed in the first row or the second row.

16. The integrated circuit of claim 15, further comprising a plurality of signal lines, in the conductive layer, spaced apart each other by a first pitch in a second horizontal direction orthogonal to the first horizontal direction and extending in the first horizontal direction,
wherein a width of the power line is greater than a width of the signal lines at least by the first pitch.

17. The integrated circuit of claim 15, further comprising:
a first via configured to provide the supply voltage to a standard cell placed in the first row, wherein the first via is arranged at a first edge of the power line; and
a second via configured to provide the supply voltage to a standard cell placed in the second row, wherein the second via is arranged at a second edge of the power line that faces the first edge of the power line.

18. The integrated circuit of claim 14, further comprising a first power line and a second power line respectively extending in the first horizontal direction in a conductive layer over a region between the second active region of the first row and the third active region of the second row, wherein the first power line and the second power line are configured to provide a supply voltage respectively to the standard cells placed in the first row and the standard cells placed in the second row.

19. The integrated circuit of claim 14, further comprising a plurality of fins extending in the first horizontal direction and spaced apart from one another by a second pitch in a second horizontal direction orthogonal to the first horizontal direction, wherein pitches of the first row and the second row are respectively multiples of the second pitch.

20. The integrated circuit of claim 14, wherein the active regions of the first row comprise an active region terminated by a first diffusion break, wherein the active regions of the second row comprise an active region terminated by a second diffusion break aligned to the first diffusion break in a second horizontal direction that is orthogonal to the first horizontal direction, and wherein the first diffusion break and the second diffusion break are separated in the second horizontal direction.

* * * * *